(12) United States Patent
Losh et al.

(10) Patent No.: US 9,170,897 B2
(45) Date of Patent: Oct. 27, 2015

(54) APPARATUS, SYSTEM, AND METHOD FOR MANAGING SOLID-STATE STORAGE RELIABILITY

(71) Applicant: Fusion-io, Inc., Salt Lake City, UT (US)

(72) Inventors: Warner Losh, Broomfield, CO (US);
James G. Peterson, San Jose, CA (US)

(73) Assignee: SANDISK TECHNOLOGIES, INC., Plano, TX (US)

( * ) Notice: Subject to any disclaimer, the term of this patent is extended or adjusted under 35 U.S.C. 154(b) by 237 days.

(21) Appl. No.: 13/724,812

(22) Filed: Dec. 21, 2012

(65) Prior Publication Data
US 2013/0326284 A1 Dec. 5, 2013

Related U.S. Application Data

(60) Provisional application No. 61/652,745, filed on May 29, 2012.

(51) Int. Cl.
*G06F 11/00* (2006.01)
*G06F 11/20* (2006.01)
(Continued)

(52) U.S. Cl.
CPC .......... *G06F 11/2053* (2013.01); *G06F 11/004* (2013.01); *G06F 11/1068* (2013.01); *G06F 12/0246* (2013.01); *G11C 16/349* (2013.01); *G06F 11/108* (2013.01); *G06F 12/0607* (2013.01); *G06F 2211/109* (2013.01);
(Continued)

(58) Field of Classification Search
CPC . G06F 11/004; G06F 11/0727; G06F 11/073; G06F 11/0754; G06F 11/10; G06F 11/08; G06F 11/1008; G06F 11/1004; G06F 11/1612; G06F 11/1666; G06F 11/20; G06F 11/2017; G06F 11/2053; G06F 11/3034
USPC .......... 714/47.3, 6.1, 6.11, 6.13, 6.24, 25, 42, 714/47.1, 47.2, 54
See application file for complete search history.

(56) References Cited

U.S. PATENT DOCUMENTS 5,715,193 A 2/1998 Norman
5,831,989 A 11/1998 Fujisaki
(Continued)

FOREIGN PATENT DOCUMENTS

WO WO 2010054410 5/2010

OTHER PUBLICATIONS

WIPO, International Preliminary Report on Patentability for PCT/US2009/063938, mailed May 19, 2011.
(Continued)

*Primary Examiner* — Joseph D Manoskey

(57) ABSTRACT

A storage controller may be configured to assess the reliability of a solid-state storage medium. The storage controller may be further configured to project, forecast, and/or estimate storage reliability at a future time. The projection may be based on a currently reliability metric of the storage and a reliability model. The portions or sections of the solid-state storage media may be retired in response the projected reliability metric failing to satisfy a reliability threshold. The reliability threshold may be based on data correction and/or reconstruction characteristics. The projected reliability metrics of a plurality of erase blocks of a storage division may be combined, and one or more of the erase blocks may be retired in response to determining that the combined reliability metric projection fails to satisfy the reliability threshold.

21 Claims, 19 Drawing Sheets

(51) Int. Cl.
    *G06F 11/10* (2006.01)
    *G06F 12/02* (2006.01)
    *G11C 16/34* (2006.01)
    *G11C 29/04* (2006.01)
    *G06F 12/06* (2006.01)
    *G11C 29/00* (2006.01)

(52) U.S. Cl.
    CPC . *G06F2212/1036* (2013.01); *G06F 2212/7205* (2013.01); *G06F 2212/7208* (2013.01); *G06F 2212/7211* (2013.01); *G11C 16/3418* (2013.01); *G11C 29/82* (2013.01); *G11C 2029/0409* (2013.01)

(56) References Cited

U.S. PATENT DOCUMENTS

| | | | |
|---|---|---|---|
| 5,854,796 | A | 12/1998 | Sato |
| 6,014,755 | A | 1/2000 | Wells et al. |
| 6,034,831 | A | 3/2000 | Dobbek et al. |
| 6,188,619 | B1 | 2/2001 | Jung |
| 6,684,349 | B2 * | 1/2004 | Gullo et al. ............ 714/47.2 |
| 6,725,321 | B1 | 4/2004 | Sinclair et al. |
| 7,035,967 | B2 | 4/2006 | Chang et al. |
| 7,272,755 | B2 | 9/2007 | Smith |
| 7,349,254 | B2 | 3/2008 | Prasad |
| 7,623,365 | B2 | 11/2009 | Jeddeloh |
| 7,765,426 | B2 | 7/2010 | Li |
| 7,864,579 | B2 | 1/2011 | Gutsche et al. |
| 8,001,318 | B1 | 8/2011 | Iyer et al. |
| 8,051,241 | B2 | 11/2011 | Feldman et al. |
| 8,176,367 | B2 | 5/2012 | Dreifus et al. |
| 8,195,978 | B2 | 6/2012 | Flynn et al. |
| 8,341,335 | B2 | 12/2012 | Weingarten et al. |
| 8,516,343 | B2 | 8/2013 | Flynn et al. |
| 8,601,313 | B1 * | 12/2013 | Horn ............ 714/6.32 |
| 8,612,669 | B1 | 12/2013 | Syu et al. |
| 8,806,106 | B2 | 8/2014 | Goss et al. |
| 8,806,111 | B2 | 8/2014 | Whitney |
| 8,819,498 | B2 | 8/2014 | Gearing et al. |
| 2001/0052093 | A1 | 12/2001 | Oshima et al. |
| 2002/0108016 | A1 | 8/2002 | Haines et al. |
| 2003/0204788 | A1 | 10/2003 | Smith |
| 2004/0073829 | A1 | 4/2004 | Olarig |
| 2005/0005191 | A1 | 1/2005 | Judd |
| 2005/0091452 | A1 | 4/2005 | Chen et al. |
| 2005/0204187 | A1 | 9/2005 | Lee et al. |
| 2006/0085670 | A1 | 4/2006 | Carver et al. |
| 2007/0006048 | A1 | 1/2007 | Zimmer et al. |
| 2007/0106870 | A1 | 5/2007 | Bonwick et al. |
| 2007/0118713 | A1 | 5/2007 | Guterman et al. |
| 2007/0150654 | A1 | 6/2007 | Kim et al. |
| 2007/0245068 | A1 | 10/2007 | Yero |
| 2007/0255889 | A1 | 11/2007 | Yogev et al. |
| 2007/0266200 | A1 | 11/2007 | Gorobets et al. |
| 2007/0266276 | A1 | 11/2007 | Gatzemeier et al. |
| 2008/0010566 | A1 | 1/2008 | Chang et al. |
| 2008/0082725 | A1 | 4/2008 | Elhamias |
| 2008/0120518 | A1 | 5/2008 | Ritz et al. |
| 2008/0141043 | A1 | 6/2008 | Flynn et al. |
| 2008/0244368 | A1 | 10/2008 | Chin et al. |
| 2009/0077429 | A1 | 3/2009 | Yim et al. |
| 2009/0089603 | A1 | 4/2009 | Ding et al. |
| 2009/0300277 | A1 | 12/2009 | Jeddeloh |
| 2010/0064096 | A1 | 3/2010 | Weingarten et al. |
| 2010/0174845 | A1 | 7/2010 | Gorobets et al. |
| 2010/0306580 | A1 | 12/2010 | Mckean et al. |
| 2010/0332923 | A1 | 12/2010 | D'Abreu et al. |
| 2011/0231730 | A1 | 9/2011 | Allen |
| 2011/0252289 | A1 * | 10/2011 | Patapoutian et al. ......... 714/763 |
| 2012/0023144 | A1 | 1/2012 | Rub |
| 2012/0317345 | A1 | 12/2012 | Pan et al. |
| 2013/0007380 | A1 | 1/2013 | Seekins et al. |
| 2013/0145079 | A1 | 6/2013 | Lee et al. |
| 2013/0159603 | A1 | 6/2013 | Whitney |

OTHER PUBLICATIONS

WIPO, International Search Report and Written Opinion for PCT/US2009/063938, mailed Jun. 23, 2010.

STMicroelectronics, AN1819 Application Note, "Bad Block Management in Single Level Cell NAND Flash Memories," Jan. 2006, p. 1-7.

ASINE, "ASPMC-660 Rugged IDE Flash Drive PMC Module", http://www.asinegroup.com/products/aspmc660.html, copyright 2002, visited Nov. 8, 2009.

BiTMICRO, "BiTMICRO Introduces E-Disk PMC Flash Disk Module at Military & Aerospace Electronics East 2004," http://www.bitmicro.com/press.sub, published May 18, 2004, visited Mar. 8, 2011.

Micron Technology, Inc., "NAND Flash 101: An Introduction to NAND Flash and How to Design It in to Your Next Product (TN-29-19)," http://www.micron.com/~/media/Documents/Products/Technical%20Note/NAND%20Flash/145tn2919_nand_101.pdf, 2006, visited May 10, 2010.

Samsung Electronics Co Ltd., "ECC Algorithm (512Byte)", Flash Planning Group, Memory Division, Mar. 2005, p. 1-8, ecc_algorithm_for_web_512b_March_2005.pdf=http://www.samsung.com/global/business/semiconductor/products/flash/FlashApplicationNote.html.

Asine Group, ASPMC_660, http://www.asinegroup.com/products/aspmc660.html,copyright 2002, downloaded Nov. 18, 2009.

USPTO, Office Action for U.S. Appl. No. 12/616,124 mailed Apr. 27, 2012.

USPTO, Office Action for U.S. Appl. No. 12/616,124 mailed Sep. 24, 2012.

USPTO, Office Action for U.S. Appl. No. 12/616,124 mailed Feb. 15, 2013.

USPTO, Office Action for U.S. Appl. No. 13/844,338 mailed Dec. 12, 2014.

USPTO, Office Action for U.S. Appl. No. 13/724,761 mailed Mar. 26, 2015.

* cited by examiner

APPARATUS, SYSTEM, AND METHOD FOR MANAGING SOLID-STATE STORAGE RELIABILITY

CROSS-REFERENCE TO RELATED APPLICATIONS

This Application claims priority to U.S. Provisional Patent Application No. 61/652,745, entitled, "Apparatus, System, and Method for Managing Storage Division Retirement," filed on May 29, 2012, which is hereby incorporated by reference in its entirety.

TECHNICAL FIELD

This disclosure relates to apparatus, systems, and methods for managing a solid-state storage medium and, in particular, to managing the retirement of portions of a solid-state storage medium.

BRIEF DESCRIPTION OF THE DRAWINGS

This disclosure includes and references the accompanying drawings. In the drawings, similar symbols typically identify similar components, unless context dictates otherwise. The illustrative embodiments described in the detailed description, drawings, and claims are not meant to be limiting. Other embodiments may be utilized, and other changes may be made to these exemplary embodiments, without departing from the scope of the disclosure.

DETAILED DESCRIPTION

Figure 1:
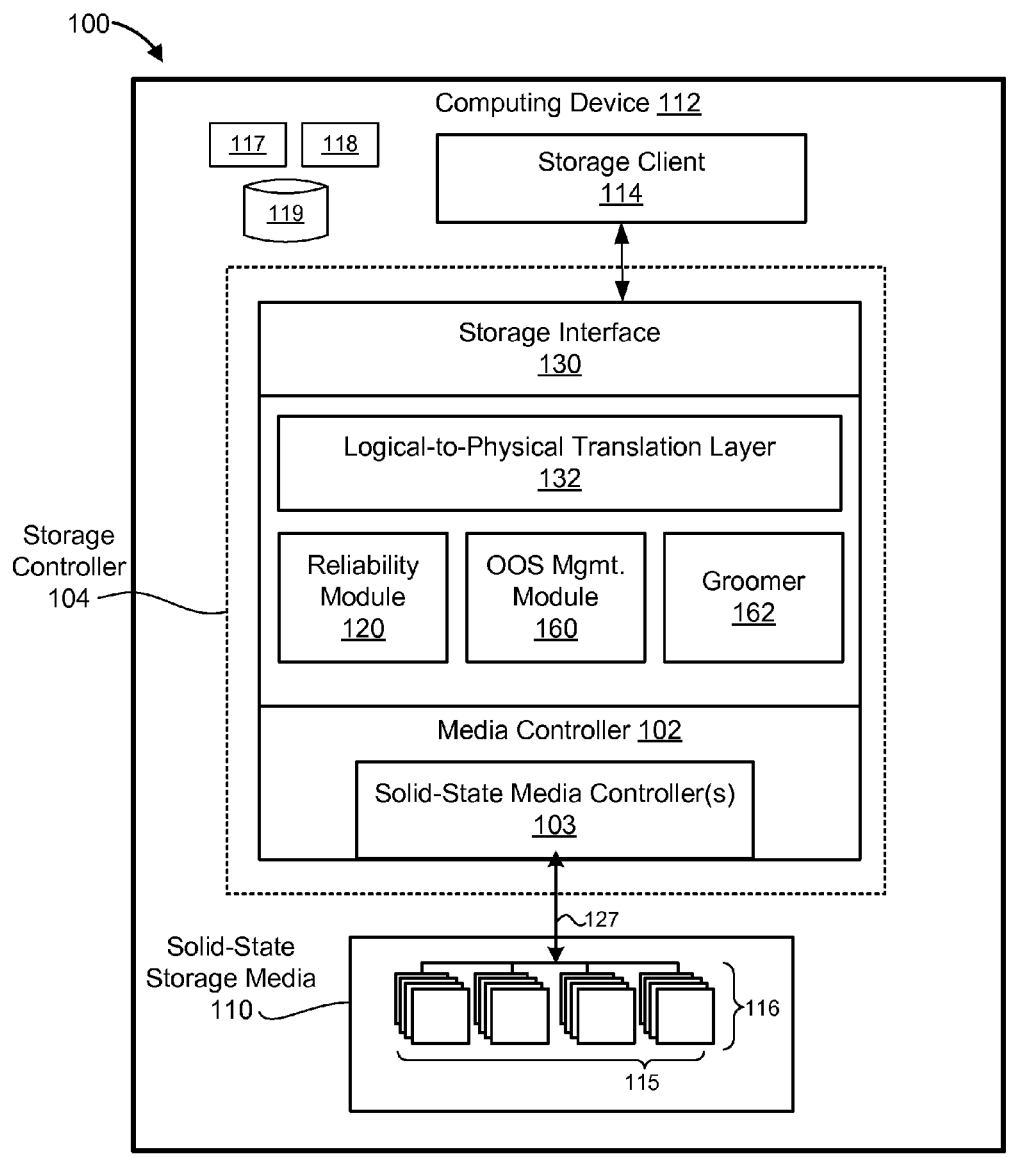
FIG. 1 is a block diagram of one embodiment of a solid-state storage system.

A storage controller may be configured to manage a solid-state storage medium, comprising a plurality of storage units. As used herein, a storage unit refers to one or more physical storage units and/or storage locations of a solid-state storage medium. A storage unit may refer to any unit of storage including, but not limited to: a page, a group, collection, or set of pages (e.g., a logical page), a sector, a block, or the like. The storage controller may be configured to manage storage divisions of the solid-state storage medium. As used herein, a "storage division," refers to a particular portion or section of a solid-state storage medium, which may include a group, collection, and/or set of storage units. Accordingly, a storage division may refer to one or more of an erase block, a group, collection and/or set of erase blocks (e.g., logical erase block), or the like.

The solid-state storage medium may have a limited lifetime and may be subject to failure conditions. These conditions may result in data errors as data is written to and/or read from the solid-state storage medium. Such errors may arise due to a number of factors, which may include, but are not limited to: wear, over-programming, read disturb, write disturb, erase disturb, programming errors, charge gain, charge loss, charge leaking, de-trapping, and so on. The probability of data errors may quantified in a "reliability metric." As used herein, a reliability metric quantifies a probability, likelihood, assurance, guarantee, or the like, that data stored on the solid-state storage medium can be successfully obtained therefrom. Accordingly, in some embodiments, a reliability metric may correspond to a bit error rate (BER) and/or raw bit error rate (RBER). BER and/or RBER metrics may be derived, at least in part, from the number of errors encountered during one or more storage operations as compared to the total amount of data transferred to and/or from the solid-state storage medium. For example, an RBER of a read operation may correspond to the number of bit errors encountered in a read operation divided by the total number of bits transferred in the read operation. The reliability metric may incorporate other factors, such as the probability of failure (e.g., based on a current and/or projected wear-level), operating conditions, profiling information, manufacturer specifications, testing and experience, and so on.

In some embodiments, the storage controller may comprise a reliability module that is configured to identify portions or sections (e.g., storage divisions) of the solid-state storage medium that are no longer sufficiently reliable to remain in service and, as such, should be retired. As used herein, storage that is out-of-service (OOS) or retired, refers to a storage resources that are no longer in use to store data. The reliability module may periodically scan the solid-state storage medium to identify storage media that should be taken OOS. Alternatively, or in addition, the reliability module may identify portions or sections of the solid-state storage medium that should be retired by monitoring storage operations as they occur and/or by accessing error profiling data pertaining to ongoing storage operations.

In some embodiments the storage controller may be configured to perform storage operations on logical storage units. As used herein, a "logical storage unit" refers to a group of two or more physical storage units, such as a group of physical pages. The storage controller may be configured to perform storage operations on the two or more physical storage units in parallel. In some embodiments, the storage controller may be configured to store data structures, such as data segments, packets, ECC codewords, or the like, on two or more of the physical storage units of a logical storage unit. The reliability characteristics of such storage operations may, therefore, incorporate the reliability characteristics of different sections of the solid-state storage medium (e.g., two or more erase blocks). The reliability module may be configured to combine the reliability metrics of the different sections of the solid-state storage medium, and may determine whether to retire the different portions based upon the combined reliability metric.

The reliability module may be configured to determine reliability information and/or manage storage retirement of arbitrarily designated "sections" or "portions" of the solid-state storage medium (e.g., storage divisions). Different sections of the solid-state storage medium may have different reliability characteristics; these differences may be due to various factors including, but not limited to: layout of the solid-state storage medium (e.g., signal paths, architecture, etc.), different wear levels in different sections of the media, access and/or use patterns (e.g., read and/or write disturb characteristics), manufacturing characteristics (e.g., manufacturing defects, etc.), and the like.

Many of the factors that contribute to data errors worsen over time. Accordingly, in certain embodiments, the reliability of a storage division may decrease the longer data remains on the storage division (e.g., the error rate may increase over time). In some embodiments, the reliability module may be configured to project or forecast changes in the reliability metric; these projections may be based on a reliability model of the non-volatile storage media (and/or storage divisions). As used herein, a "reliability model" refers to a model for projecting, forecasting, and/or estimating changes in the reliability metric of portions of a non-volatile storage medium over time (e.g., changes in the BER and/or RBER over time). The reliability model may incorporate any number of factors, which may include, but are not limited to: operating conditions, operating temperature, wear level(s) (e.g., erase cycle count, program or write cycle count, read cycle count, and so on), manufacturer specifications, operating voltage, testing and experience, and so on.

The storage controller may be configured to provide a data retention guarantee, such that data stored on the solid-state storage medium is reasonably guaranteed to be retained on and/or readable from the solid-state storage medium for the duration of a predetermined time (e.g., a data retention period), even in the absence of power. In support of this guarantee, the reliability module may be configured to project the reliability metric of the solid-state storage medium to a future time, such as the end of the data retention period, and may retire portions of the storage medium that are projected to be unreliable at the end of the data retention period (e.g., are projected to be insufficiently reliable to reasonably provide for accessing the retained data at the end of the data retention period). In some embodiments, projecting the reliability metric comprises multiplying a current error rate (e.g., RBER) by a time-based scaling factor. Portions of the solid-state storage medium that are projected to have a reliability metric that does not satisfy a "reliability threshold" may be retired. The reliability threshold may be based, at least in part, on an error correction strength, which may correspond to the number of data errors the storage controller is capable of detecting and/or correcting in data stored on the non-volatile storage medium. For example, data may be encoded in an error-correcting code (ECC) capable of correcting a pre-determined number of errors, and the reliability threshold may be set such that the number of probable errors can be corrected by the ECC encoding. Therefore, in some embodiments, the reliability threshold may be based, at least in part, upon the strength of an ECC data encoding.

As disclosed above, the reliability module may be configured to determine a projected reliability metric of different portions or sections of the solid-state storage medium in accordance with the granularity of storage operations performed thereon. In some embodiments, the reliability module is configured to determine the reliability metric of storage divisions, which may comprise groups, collections, and/or sets of storage units, such as erase blocks, logical erase blocks, or the like. Determining a reliability metric of a storage division may, therefore, comprise accumulating and/or combining the projected reliability metrics of different portions of the solid-state storage medium, such as a group of erase blocks of one or more logical storage units (e.g., by performing one or more test read operations on the logical storage units). The reliability module may be configured to retire portions of the storage division if the projected reliability metric fails to satisfy a reliability threshold. In some embodiments, portions of the storage division may be retired until the projected reliability metric of the portions of the storage division satisfies the reliability threshold. The data retention period may be 90 days.

The reliability of data retained on the solid-state storage medium may degrade over time. Reliability testing performed on "stale" data may yield inaccurate results. Accordingly, the storage controller may defer retirement of storage divisions that comprise aged data (and fail to satisfy one or more reliability thresholds). The storage controller may instead mark such storage divisions for post-write reliability testing. Post-write reliability testing may comprise evaluating the storage division for retirement after grooming and/or re-programming the storage division.

Disclosed herein are embodiments of an apparatus comprising a reliability metric module configured to determine a reliability metric of a section of a solid-state storage medium based on a storage operation performed on the section, a projection module configured to project the reliability metric to a time in the future, and a reliability module configured to retire the storage division in response to the projected reliability metric failing to satisfy a reliability threshold. The apparatus may further comprise a groomer module configured to relocate data stored on the retired storage division.

The reliability metric may be based on an error rate of one or more storage operations performed on storage units in the section. The storage operations may be performed by a scan module configured to perform test storage operations on storage divisions of the solid-state storage medium. The scan module may be configured to perform the test read operations according to a predetermined scanning pattern.

The reliability threshold may be based on one or more of an error-correcting code strength of data stored on the storage division, data reconstruction characteristics, and/or parity characteristics.

The apparatus may further comprise a projection module that is configured to project, forecast, and/or estimate storage division reliability at a future time. In some embodiments, the projection module is configured to project the reliability metric to the end of a data retention period. The projection module may determine the reliability projection, forecast, and/or estimate by use of a reliability model, which may comprise a reliability scaling factor, a linear reliability model, an exponential reliability model, a polynomial reliability model, a spline reliability model, an artificial neural network model, a radial basis function model, a combination of models, or the like.

The section may comprise a storage division, which may include one or more storage units, such as pages, erase blocks, or the like. The section may be adapted according to the granularity of storage operations performed on the solid-state storage medium. The section may comprise a plurality of erase blocks, and the projected reliability of the section may be based on reliability projections of the erase blocks. The reliability metric of an erase block may be based on storage operation errors attributed to the erase block. The projected reliability metric of the section may be a combination of the reliability metrics of the erase blocks comprising the section (e.g., an average of the erase block reliability metrics).

The reliability module may be configured to retire one or more of the erase blocks in response to the projected reliability metric of the section failing to satisfy the reliability threshold. The retired erase blocks may be replaced by other erase blocks. An updated projected reliability metric of the section may be determined based on the projected reliability of the replacement erase blocks.

Disclosed herein are embodiments of a method for managing solid-state storage media. The methods disclosed herein may be embodied, at least in part, as instructions on a machine-readable storage medium. The instructions may be configured for execution by use of one or more computing device components, which may include, but are not limited to: processors, co-processors, special-purpose processors, general-purpose processors, programmable and/or configurable processing components, input/output components, communication components, network interfaces, memory components, storage components, and the like.

Embodiments of the methods disclosed herein may comprise forecasting reliability of a portion of a solid-state storage medium at a future time, wherein the reliability forecast is based on a current reliability metric of the portion, and removing the portion from service in response to the reliability forecast of the storage division failing to satisfy a data retention guarantee. Removing the storage division from service may further comprise relocating data stored on the storage division.

The data retention guarantee may be based on one or more of an error-correcting code strength and a data reconstruction capability for data stored on the solid-state storage medium. The reliability metric may be based on a raw bit error rate of one or more test read operations performed on the storage division.

The portion may comprise plurality of erase block, such as a logical erase block or portion of a logical erase block. Forecasting the reliability of the portion may comprise combining reliability forecasts of each erase block. The disclosed methods may further comprise removing one or more of the erase blocks from service in response to the reliability forecast of the portion failing to satisfy the data retention guarantee.

The disclosed methods may further comprise attributing errors of one or more test read operations to respective erase blocks, wherein the reliability forecasts of the physical erase blocks are derived from errors attributed to the respective physical erase blocks.

Disclosed herein are embodiments of a system, comprising means for measuring storage division reliability by use of one or more test read operations performed on the storage division, means for estimating storage division reliability at an end of a data retention period based on the measured storage division reliability and a reliability model, and means for retiring the storage division in response to the estimated reliability failing to satisfy a reliability threshold. The storage division may comprise a plurality of erase blocks, and the disclosed systems may further comprise means for attributing errors of the one or more test read operations to respective erase blocks, means for determining a respective reliability metric for each erase block, and means for estimating reliability of the storage division based on the reliability metrics of the erase blocks and a reliability model, wherein the means for retiring the storage division comprises means for retiring one or more of the erase blocks in response to the estimated probability of the storage division satisfy the reliability threshold.

FIG. 1 is a schematic block diagram illustrating one embodiment of a system 100 comprising a storage controller 104 configured to manage a solid-state storage media 110. The storage controller 104 may comprise a media controller 102 (which may comprise one or more solid-state media controller(s) 103), a logical-to-physical translation layer 132, a reliability module 120, and an out-of-service management module 160.

The solid-state storage media 110 may comprise non-volatile, solid-state storage media, such as flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), Resistive Random-Access Memory (RRAM), Programmable Metallization Cell (PMC), Conductive-Bridging RAM (CBRAM), Magneto-Resistive RAM (MRAM), Dynamic RAM (DRAM), Phase change RAM (PRAM), or the like. The solid-state media controller(s) 103 may be configured to write data to and/or read data from the solid-state storage media 110 via a bus 127. The bus 127 may comprise a storage I/O bus for communicating data to/from the solid-state storage media 110, and may further comprise a control I/O bus for communicating addressing and other command and control information to the solid-state storage media 110.

The storage controller 104 may comprise and/or be implemented on a computing device 112. In some embodiments, portions of the storage controller 104 may be internal to the computing device 112; for example, portions of the storage controller 104 and/or solid-state storage media 110 may be connected using a system bus, such as a peripheral component interconnect express (PCI-e) bus, a Serial Advanced Technology Attachment (serial ATA) bus, or the like. The disclosure is not limited in this regard; in some embodiments, components of the storage controller 104 may be external to the computing device 112, and may be connected via a universal serial bus (USB) connection, an Institute of Electrical and Electronics Engineers (IEEE) 1394 bus (FireWire), an external PCI bus, Infiniband, or the like.

The computing device 112 may comprise a processor 117, volatile memory 118, and/or persistent storage 119. The processor 117 may comprise one or more general and/or special purpose processing elements. The processor 117 may be configured to execute instructions loaded into the volatile memory 118 from the persistent storage 119. Portions of one or more of the modules of the storage controller 104 may be embodied as machine-readable instructions stored on the persistent storage 119. The instructions may be configured for execution by the processor 117 to implement one or more of the modules and/or methods described herein.

One or more storage clients 114 may access storage services provided by the storage controller 104 through a storage interface 130. The storage interface 130 may comprise a block device interface, a virtual storage interface (VSL), or other suitable storage interface and/or Application Programming Interface (API). The storage controller 104 may further comprise a logical-to-physical translation layer 132 to map and/or associate identifiers of the storage client 114 with physical storage locations (e.g., physical addresses) on the solid-state storage media 110. The logical-to-physical translation layer 132 may provide for "any-to-any" mappings between logical identifiers and physical storage locations, such that data may be written and/or updated "out-of-place" on the solid-state storage media 110. As used herein, a physical address refers to an address (or other reference) capable of referencing a particular storage location on the solid-state storage media 110. Accordingly, a physical address may be a "media address."

The storage controller 104 may be configured to maintain metadata pertaining to solid-state storage media 110 including, but not limited to: an index comprising the any-to-any mappings between logical identifiers and physical storage locations of the solid-state storage media 110, a reverse index pertaining to the contents of the solid-state storage media 110, one or more validity bitmaps, reliability testing and/or status metadata, and so on. The metadata may be stored on the volatile memory 118 and/or may be periodically stored on a persistent storage medium, such as the persistent storage 119 and/or solid-state storage media 110.

In some embodiments, the solid-state storage media 110 may comprise a plurality of solid-state storage elements 116 (an array of solid-state storage elements 116). As used herein, a solid-state storage element 116 refers to a solid-state storage package, chip, die, plane, or the like. Groups or banks of solid-state storage elements 116 may be communicatively coupled to the media controller 102 (and/or solid-state media controller(s) 103) in parallel, forming one or more logical storage elements 115. As used herein, a logical storage element 115 refers to a set of two or more solid-state storage elements 116 that are capable of being managed in parallel (e.g., via an I/O and/or control bus 127). A logical storage element 115 may comprise a plurality of logical storage units, such as logical pages, logical erase blocks, or the like. As used herein, a "logical storage unit" refers to a logical construct combining two or more physical storage units, each physical storage unit on a respective solid-state storage element 116 (each solid-state storage element 116 being accessible in parallel). A logical erase block refers to a set of two or more physical erase blocks. In some embodiments a logical erase block may comprise erase blocks within respective logical storage elements 115 and/or banks. Alternatively, a logical erase block may comprise erase blocks within a plurality of different logical storage elements 115 and/or may span multiple banks of solid-state storage elements.

The reliability module 120 may be configured to identify portions of the solid-state storage media 110 that should be retired or taken OOS. As used herein, "retiring" a portion of the solid-state storage media 110 refers to indicating that the portion should not be used to store data. Portions of the solid-state storage media 110 may be taken out of service in response to various conditions including, but not limited to: the reliability module 120 determining that the portion is not sufficiently reliable, or is projected to become unreliable within a pre-determined time, a failure condition, partial failure, inaccessibility, unacceptable performance (e.g., long read, program, and/or erase times), programming errors, read errors, wear, or the like.

The reliability module 120 may be configured to determine a reliability metric for different portions of the solid-state storage media 110 (e.g., storage divisions). As disclosed above, a storage division may refer to any portion of the solid-state storage medium 110, including, but not limited to: one or more pages, one or more logical pages, an erase block, a group, collection, and/or set of erase blocks (e.g., a logical erase block), or the like. The storage divisions may be configured in accordance with the partitioning of the solid-state storage media 110 and/or the granularity of storage operations performed on the solid-state storage media 110. The reliability metric of a storage division may, therefore, quantify the reliability of storage operations performed on the solid-state storage media 110 by the storage controller 104 (e.g., may correspond to the probability of errors in data written to and/or read from the solid-state storage media 110). The reliability metric of a storage division may comprise a bit error rate (BER), a raw bit error rate (RBER), time-to-failure estimate, wear-level, read and/or write cycle count, or the like. In some embodiments, storage divisions may be retired based on a projected reliability metric. As used herein, a "projected reliability metric" refers to a projection, estimate, and/or forecast of the reliability of a storage division at future time (e.g., after a pre-determined time period, such as the data retention period, described above, and/or one or more other event(s)). For example, the projected reliability metric of a storage division after a 90-day data retention period refers to a projection of the reliability of the storage division 90 days into the future.

The reliability module 120 may be configured to calculate a reliability metric of the storage division (e.g., based on one or more test operations), to project, forecast, and/or estimate the reliability metric at the end of a pre-determined time period, and determine whether to retire the storage division based on the projected reliability metric. Retiring a storage division may comprise storing an indication that the storage division (or portions thereof) is to be taken OOS (e.g., no longer used to store data). The indication may be stored in storage metadata, on the solid-state storage media 110, on the computer-readable storage 119, or the like.

The OOS management module 160 may be configured to avoid portions of the solid-state storage medium 110 that have been taken OOS. Avoiding an OOS storage location may comprise replacing OOS storage resources with replacement resources (e.g., remapping), masking OOS storage resources (e.g., mapping nonce and/or padding data to the OOS storage location), a hybrid approach combining remapping and masking, or the like.

The storage controller 104 may further comprise a groomer module 162, which is configured to perform grooming operations on the solid-state storage media 110. Grooming operations may include, but are not limited to: reclaiming storage resources, erasure, wear leveling, refreshing data stored on the solid-state storage media 110, and so on. The groomer module 162 may operate outside of the path for servicing other, higher-priority storage operations and/or requests. Therefore, the groomer module 162 may operate as an autonomous, background process, which may be suspended and/or deferred while other storage operations are in process. Alternatively, the groomer module 162 may operate in the foreground while other storage operations are being serviced. The groomer 162 may wear-level the non-volatile storage media 110, such that data is systematically spread throughout different storage locations, which may improve performance, data reliability, and avoid overuse and/or underuse of particular storage locations, thereby lengthening the useful life of the solid-state storage media 110. Grooming an erase block (or logical erase block) may comprise relocating valid data (if any) to other storage locations, erasing the erase block, and/or initializing the erase block for storage operations (e.g., marking the erase block with a sequence indicator, sequence number, timestamp, or the like). The groomer module 162 may operate within a driver of the storage controller 104. Alternatively, or in addition, portions of the groomer module 162 may be implemented on the solid-state media controller 103 (e.g., as hardware components, firmware, programmable hardware components, or the like).

Figure 2:
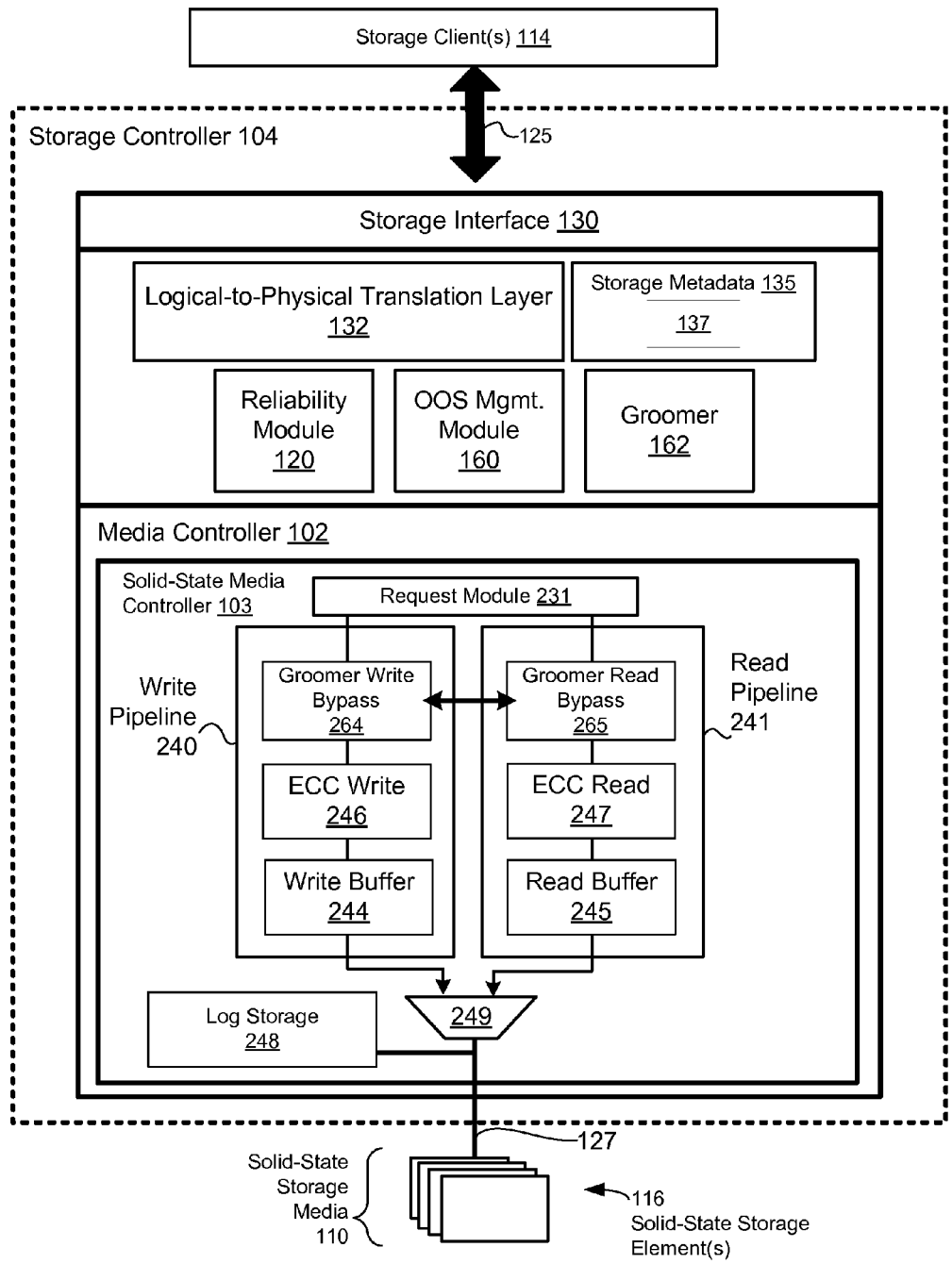
FIG. 2 is a block diagram of one embodiment of a solid-state storage controller.

FIG. 2 is a block diagram depicting one embodiment of a storage controller 104 configured to manage data storage operations on a solid-state storage media 110. In some embodiments, the solid-state storage media 110 may comprise a plurality of solid-state storage elements 116, which may be communicatively coupled to the solid-state media controller 103 via a bus 127, as described above.

The solid-state media controller 103 may comprise a request module 231 configured to receive storage requests from the storage controller 104 and/or other storage clients 114. The request module 231 may be configured to perform storage operations on the solid-state storage media 110 in response to the requests, which may comprise transferring data to/from the storage controller 104 and/or storage clients 114. Accordingly, the request module 231 may comprise one or more direct memory access (DMA) modules, remote DMA modules, bus controllers, bridges, buffers, and the like.

The solid-state media controller 103 may comprise a write pipeline 240 that is configured to process data for storage on the solid-state storage media 110. In some embodiments, the write pipeline 240 comprises one or more data processing stages, which may include, but are not limited to: compression, encryption, packetization, media encryption, error encoding, and so on.

Error encoding may comprise encoding data packets (or other data containers) in an error-correcting code (ECC) using, inter alia, the ECC write module 246. ECC encoding may comprise generating ECC codewords, each of which may comprise a data segment of length N and a syndrome of length S. For example, the ECC write module 246 may be configured encode data segments into 240 byte ECC chunks, each ECC chunk comprising 224 bytes of data and 16 bytes of ECC data. In this embodiment, the ECC encoding may be capable of correcting more bit errors than the manufacturer of the solid-state storage media 110 requires. In other embodiments, the ECC write module 246 may be configured to encode data in a symbolic ECC encoding, such that each data segment of length N produces a symbol of length X. The ECC write module 246 may encode data according to a selected ECC "strength." As used herein, the "strength" of an error-correcting code refers to the number of errors that can be detected and/or corrected by use of the error correcting code. In some embodiments, the strength of the ECC encoding implemented by the ECC write module 246 may be adaptive and/or configurable. In some embodiments, the strength of the ECC encoding may be selected according to the reliability and/or error rate of the solid-state storage media 110.

The ECC write module 246 may be further configured to calculate parity data for one or more data segments (or other data structures). The parity data may be used with (or in place of) the ECC encoding, described above. Parity data may be used to detect and/or correct errors in data stored on the solid-state storage medium 110 (e.g., using parity substitution, as described below).

The write pipeline 240 may be configured to store data in a "contextual format" on the solid-state storage media 110. As used herein, a contextual format refers to a data format in which a logical interface of a data segment is associated with the data segment on the solid-state storage media 110. For example, a contextual packet format may include a packet header comprising one or more logical identifiers of a data segment, or the like. The contextual format may be used to reconstruct the logical-to-physical translation layer 132 (and/or storage metadata 135) of the storage controller 104, in the event storage metadata 135 (e.g., forward index) of the storage controller 104 is lost or corrupted.

The write buffer 244 may be configured to buffer data for storage on the solid-state storage media 110. In some embodiments, the write buffer 244 may comprise one or more synchronization buffers to synchronize a clock domain of the solid-state media controller 103 with a clock domain of the solid-state storage media 110 (and/or bus 127).

The log storage module 248 may be configured to select media storage location(s) for data storage and/or may provide addressing and/or control information to the non-volatile storage media 110 via the bus 127. Accordingly, the log storage module 248 may provide for storing data sequentially at an append point within the physical address space of the solid-state storage media 110. The physical address at which a particular data segment is stored may be independent of the logical interface (e.g., logical identifier) of the data segment. The logical-to-physical translation layer 132 may be configured to associate the logical interface of data segments (e.g., logical identifiers of the data segments) with the physical address(es) of the data segments on the solid-state storage media 110. In some embodiments, the logical-to-physical translation layer 132 may comprise storage metadata 135, which may include a forward index comprising arbitrary, any-to-any mappings between logical identifiers and media addresses. The storage metadata 135 may be maintained in volatile memory, such as the volatile memory 118. In some embodiments, the storage controller 104 is configured to periodically store portions of the storage metadata 135 on a persistent storage medium, such as the solid-state storage media 110, persistent storage 119, or the like.

The solid-state media controller 103 may further comprise a read pipeline 241 that is configured to read data from the solid-state storage media 110 in response to requests received via the request module 231. The requests may comprise and/or reference the logical interface of the requested data, such as a logical identifier, a range and/or extent of logical identifiers, a set of logical identifiers, or the like. The physical addresses associated with data of the request may be determined based, at least in part, upon the logical-to-physical translation layer 132 (and/or storage metadata 135) maintained by the storage controller 104. Data may stream into the read pipeline 241 via the read buffer 245 and in response to addressing and/or control signals provided via the bus 127. The read buffer 245 may comprise one or more read synchronization buffers for clock domain synchronization, as described above.

The read pipeline 241 may be configured to process data read from the non-volatile storage media 110, and provide the processed data to the storage controller 104 and/or a storage client 114. The read pipeline 241 may comprise one or more data processing stages, which may include, but are not limited to: error correction, media decryption, depacketization, decryption, decompression, and so on. Data processed by the read pipeline 241 may flow to the storage controller 104 and/or storage client 114 via the request module 231, and/or other interface or communication channel (e.g., the data may flow directly to/from a storage client via a DMA or remote DMA module of the storage controller 104).

The read pipeline 241 may comprise an ECC read module 247 configured to detect and/or correct errors in data read from the solid-state storage media 110 using, inter alia, the ECC encoding of the data (e.g., as encoded by the ECC write module 246), parity data (e.g., using parity substitution), and so on. The ECC encoding may be capable of detecting and/or correcting a pre-determined number of bit errors, in accordance with the strength of the ECC encoding. The ECC read module 247 may be capable of detecting more bit errors than can be corrected.

The ECC read module 247 may be configured to correct any "correctable" errors using the ECC encoding. In some embodiments, the ECC read module 247 may attempt to correct errors that cannot be corrected using the ECC encoding using other techniques, such as parity substitution, or the like. Alternatively, or in addition, the ECC read module 247 may attempt to recover data comprising uncorrectable errors from another source. For example, in some embodiments, data may be stored in a RAID configuration. In response to detecting an uncorrectable error, the ECC read module 247 may attempt to recover the data from the RAID, or other source of redundant data (e.g., a mirror, backup copy, or the like).

In some embodiments, the ECC read module 247 may be configured to generate an interrupt in response to reading data comprising uncorrectable errors. The interrupt may comprise a message indicating that the requested data is in error, and may indicate that the ECC read module 247 cannot correct the error using the ECC encoding. The message may comprise the data that includes the error (e.g., the "corrupted data"). The interrupt may be caught by the storage controller 104 or other process.

In some embodiments, the storage controller 104 may correct errors in corrupted data using alternative error correction techniques, such as parity substitution, or the like. Parity substitution may comprise iteratively replacing portions of the corrupted data with a "parity mask" (e.g., all ones) until a parity calculation associated with the data is satisfied. The masked data may comprise the uncorrectable errors, and may be reconstructed using other portions of the data in conjunction with the parity data. Alternatively, the storage controller 104 may replace the corrupted data with another copy of the data, such as a backup or mirror copy, and then may use the replacement data of the requested data packet or return it to the read pipeline 241. In another embodiment, the storage controller 104 stores data in a RAID configuration, from which the corrupted data may be recovered, as described above.

Further embodiments of apparatus, systems, and methods for detecting and/or correcting data errors are disclosed in United States Patent Application Publication No. 2009/0287956 (Ser. No. 12/467,914), entitled, "Apparatus, System, and Method for Detecting and Replacing a Failed Data Storage," filed May 18, 2009, which is hereby incorporated by reference in its entirety. The solid-state media controller 103 may further comprise a multiplexer 249 that is configured to selectively route data and/or commands between the write pipeline 240 and read pipeline 241, and solid-state storage media 110. In some embodiments, solid-state media controller 103 may be configured to read data while filling the write buffer 244 and/or may interleave one or more storage operations on one or more banks of solid-state storage elements (as described below in conjunction with FIG. 4A). Further embodiments of write and/or read pipelines are disclosed in United States Patent Application Publication No. 2008/0141043 (Ser. No. 11/952,091), entitled, "Apparatus, System, and Method for Managing Data using a Data Pipeline," filed Dec. 6, 2007, which is hereby incorporated by reference in its entirety.

As discussed above, the groomer module 162 may be configured to reclaim storage resources on the solid-state storage media 110. The groomer module 162 may operate as an autonomous, background process, which may be suspended and/or deferred while other storage operations are in process. The groomer module 162 may manage the solid-state storage media 110 so that data is systematically spread throughout media addresses of the solid-state storage media 110, which may improve performance, data reliability, and avoid overuse and underuse of any particular storage locations, thereby lengthening the useful life of the solid-state storage media 110 (e.g., wear-leveling, etc.).

In some embodiments, the groomer module 162 may interleave grooming operations with other storage operations and/or requests. For example, reclaiming a storage resource, such as an erase block or logical erase block (e.g., set of two or more erase blocks), may comprise relocating valid data stored on the logical erase block to other storage locations on the solid-state storage media 110. The groomer write and groomer read bypass modules 264 and 265 may be configured to allow data packets to be read into the read pipeline 241 and then be transferred directly to the write pipeline 240 without being routed out of the storage media controller 103.

The groomer read bypass module 265 may coordinate reading data to be relocated from the storage resource that is being reclaimed. The groomer module 162 may be configured to interleave the relocation data with other data being written to the non-volatile storage media 110 via the groomer write bypass 264. Accordingly, data may be relocated without leaving the solid-state media controller 103. In some embodiments, the groomer module 162 may be configured to fill the remainder of the write buffer 244 with relocation data, which may improve groomer efficiency, while minimizing the performance impact of grooming operations.

Figure 3A:
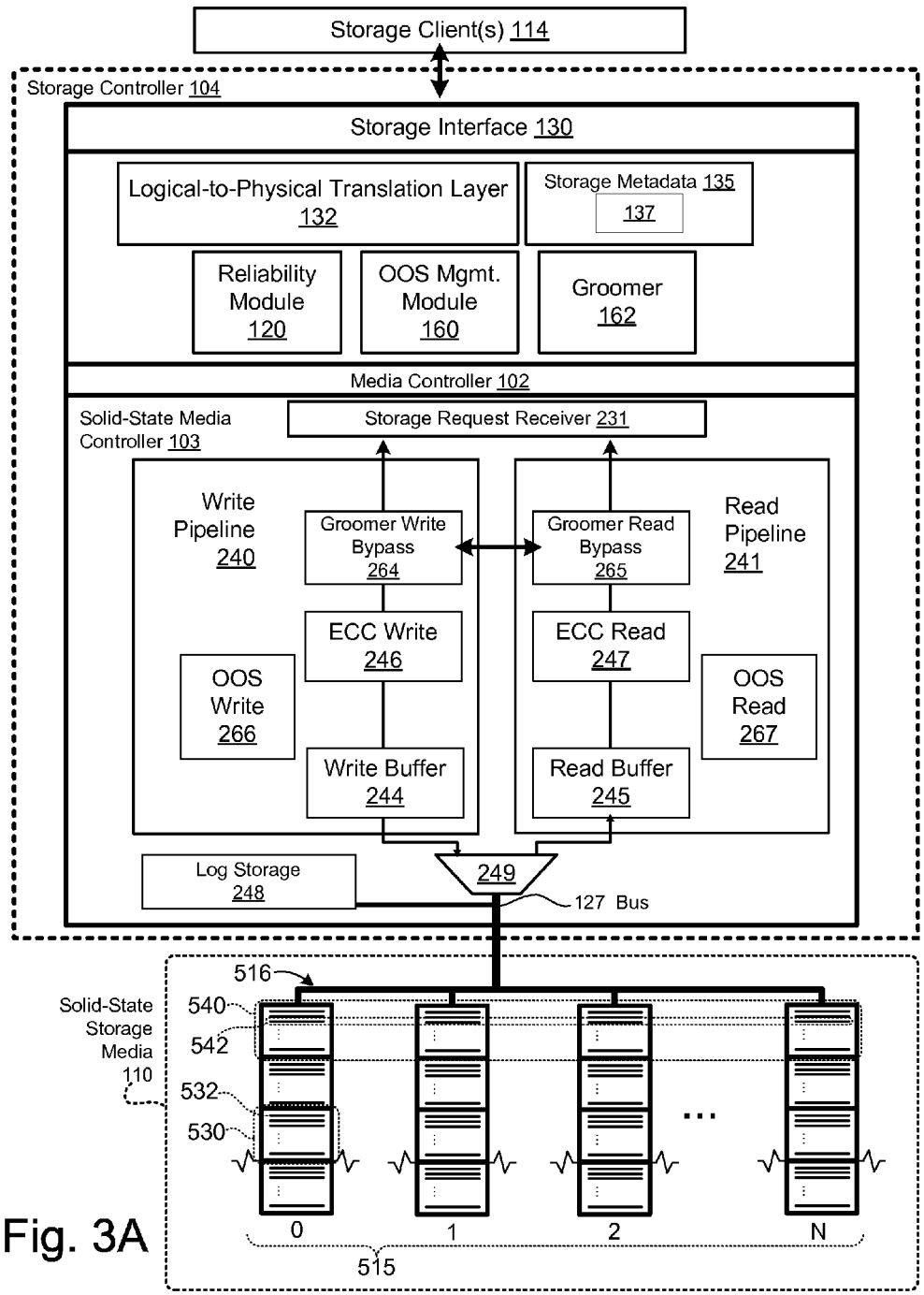
FIG. 3A is a block diagram of another embodiment of a solid-state storage controller.

FIG. 3A depicts another embodiment of a storage controller 104. In the FIG. 3A embodiment, the solid-state storage media 110 may comprise a plurality of solid-state storage elements 116 (elements 516 0 through N). Each solid-state storage element 116 may be partitioned into a plurality of erase blocks 530. Each erase block may comprise a plurality of storage units (e.g., pages) 532. Each storage unit 532 may be addressable by the solid-state media controller 103. The solid-state storage elements 116 may be communicatively coupled to the solid-state media controller 103 (via the bus 127), and the solid-state media controller 103 may be configured to manage the solid-state storage elements 516 as a logical storage element 515.

Figure 5A:
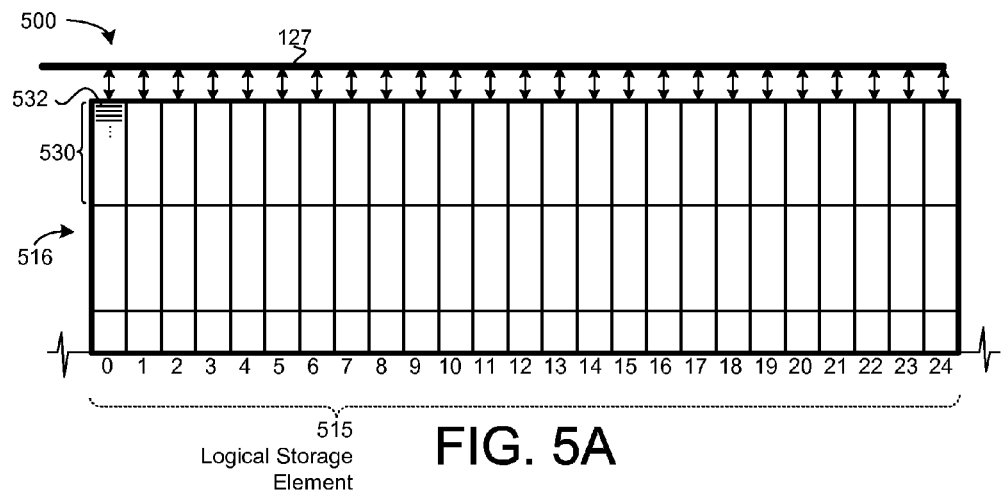
FIG. 5A is a block diagram of one embodiment of a logical storage element.

FIG. 5A is a block diagram of one embodiment of a logical storage element 515 comprised of a plurality of solid-state storage elements 516. The FIG. 5A embodiment includes twenty-five (25) solid-state storage elements 516 connected via a bus 127. The bus 127 may couple the logical storage element 515 to the storage controller 104 (through the solid-state media controller 103), as described above. In some embodiments, storage operations performed on the logical storage element 515 may be performed on a plurality of the constituent solid-state storage elements 516 in parallel; when data is read and/or written to the logical storage element 515, the data may be read and/or written to a plurality of the physical storage elements 516. Operations may be performed concurrently between the two or more banks of the logical storage element 515, as disclosed in additional detail in conjunction with FIGS. 5C-F.

The solid-state storage elements 516 may be embodied on separate chips, packages, die, or the like. Alternatively, or in addition, one or more of the solid-state storage elements 516 may share the same package and/or chip (e.g., be separate die and/or planes on the same chip). The solid-state storage elements 516 comprise respective erase blocks 530, each comprising a plurality of storage units 532 (e.g., pages). However, the disclosure could be adapted to use different types of solid-state storage media 110 comprising different media partitioning schemes and, as such, should not be read as limited in this regard.

Figure 5B:
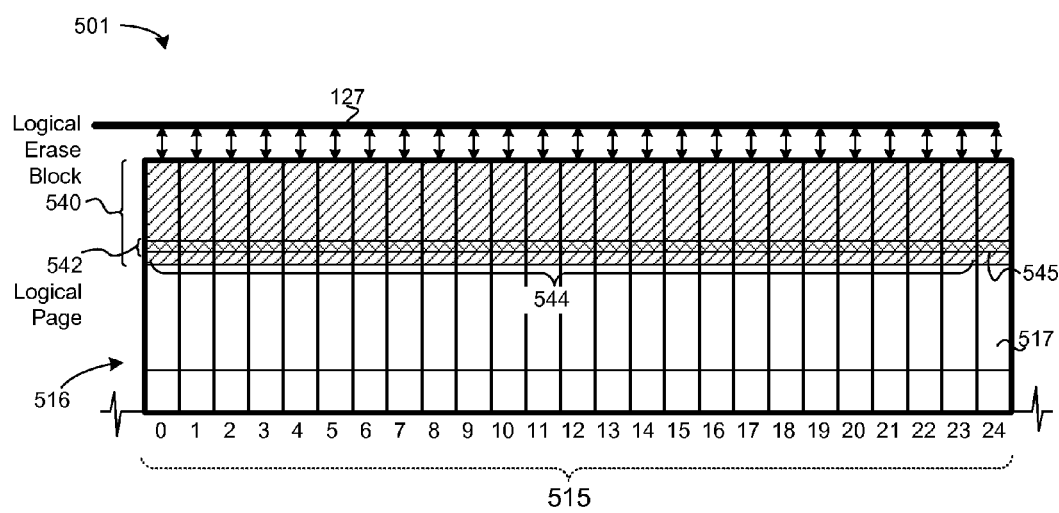
FIG. 5B is a block diagram depicting one embodiment of a logical storage element.

The storage controller 104 may be configured to perform storage operations on logical storage units 542 and/or logical erase blocks 540 of the logical storage element 515. In the FIG. 5B embodiment, each logical erase block 540 comprises an erase block 530 of a respective storage element 516 "0" through "24," and each logical page 542 comprises a physical page 532 of a respective storage element 516 "0" through "24." Accordingly, each logical erase block 540 may comprise as many as twenty-five (25) erase blocks 530, and each logical page 542 may comprise as many as twenty-five (25) physical pages 532. Although the logical erase block 540 of FIG. 5B includes erase blocks 530 within a single logical storage element 515, the disclosure is not limited in this regard; in some embodiments, described below, the logical erase block 540 may span a plurality of logical storage elements 515 and/or banks of storage elements 516.

The storage controller 104 may be configured to perform storage operations on logical storage element 515, which may operate across the constituent solid-state storage elements 516: an operation to read a logical page 542 comprises reading from as many as twenty-five (25) physical pages 532 (e.g., one storage unit per solid-state storage element 516); an operation to program a logical page 542 comprises programming as many as twenty-five (25) physical pages 532; an operation to erase a logical erase block 540 comprises erasing as many as twenty-five (25) erase blocks 530; and so on. Accordingly, the effective read/write bandwidth of the logical storage element 515 may be proportional to the number of solid-state storage elements 516 included therein.

Arranging solid-state storage elements 516 into logical storage elements 515 may be used to address certain properties of the solid-state storage media 110. For example, the solid-state storage media 110 may have asymmetric properties; it may take ten (10) times as long to program data on a solid-state storage element 516 as it takes to read data from the solid-state storage element 516. Moreover, in some cases, data may only be programmed to erase blocks 530 that have been initialized (e.g., erased). An erase operation may take ten (10) times as long as a program operation (and by extension one hundred (100) times, or more, longer than a read operation).

The arrangement of the solid-state storage elements 516 into logical storage elements 515 (and/or interleaved banks as described herein), may allow the storage controller 104 to address the asymmetric properties of the solid-state storage media 110. In some embodiments, the asymmetry in read, program, and/or erase operations is addressed by performing these operations on many elements 116 in parallel (e.g., on a logical storage element 515). In the FIG. 5B embodiment, programming asymmetry may be addressed by programming twenty-five (25) physical pages 532 in a logical page 542 in parallel. Performing multiple program operations in parallel may increase the effective write or programming bandwidth. The effective program bandwidth of the logical storage element 515 depicted in FIGS. 5A and 5B may be as much as twenty-five (25) times that of the program bandwidth of the same twenty-five (25) solid-state storage elements 516 in serial. The increase to programming bandwidth may be used to "mask" the asymmetry between write/program and read operations. Erase operations may be performed on a multiple erase blocks (e.g., logical erase blocks 540). Erasing a logical erase block 540 may, therefore, comprise erasing twenty-five (25) separate erase blocks 530 in parallel. Like the logical programming operations described above, implementing erase operations on logical erase blocks 540 in parallel may allow the storage controller 104 to manage asymmetry between erase, program, and read operations.

In some embodiments, a certain portion of a logical storage element 115 may be configured to store error detection and/or recovery data. For example, one of the storage elements 516 (denoted 517 in FIG. 5B) may be used to store parity data. In this embodiment, the effective capacity and/or bandwidth of the logical storage element 515 may be reduced (e.g., reduced from twenty-five (25) physical pages 530 to twenty-four (24) physical pages 530); the first twenty-four (24) physical pages 544 are used to store data, and physical page 545 is dedicated to storing parity data. As used herein, "effective capacity and/or bandwidth" refers to the number of storage units or divisions that are available to store data and/or the total amount of data that can be stored and/or read in parallel. The operational mode described above may be referred to as a "24+1" configuration, denoting that twenty-four (24) physical storage units are available to store data, and one (1) of the physical storage units is used for parity data. The logical storage element 515 could be configured to operate in any number of operational modes, in which any proportion of the solid-state storage elements 516 are used to store error detection and/or recovery data, and as such, the disclosure should not be read as limited in this regard.

As illustrated above, the storage controller 104 may be configured to perform storage operations on logical storage units (logical pages 542) of the solid-state storage media 110, each of which may comprise as many as twenty five erase blocks 530. The reliability module 120 may be configured to track reliability metrics of the solid-state storage medium 110 at a corresponding level of granularity. Accordingly, the reliability module 120 may be configured to determine reliability characteristics of storage sections that correspond to the logical erase blocks 540, which, as disclosed herein, may comprise combining the reliability metrics of individual erase blocks 530.

Although particular embodiments of logical storage elements 515 as disclosed herein, the disclosure is not limited in this regard and could be adapted to incorporate logical storage elements 515 of differing sizes and/or configurations. The size and number of erase blocks, pages, planes, or other logical and physical divisions within the solid-state storage elements 516 are expected to change over time with advancements in technology; it is to be expected that many embodiments consistent with new configurations are possible and are consistent with the embodiments disclosed herein.

Referring back to FIG. 3A, as described above, the storage controller 104 may be configured to continue operating when storage units in the solid-state storage media 110 fail and/or are taken out of service (e.g., are retired). The reliability module 120 may be configured to identify portions of the solid-state storage media 110 that should be taken OOS (e.g., pages, erase blocks, die, planes, chips, etc.). In some embodiments, the solid-state media controller 103 may maintain profiling information pertaining to the solid-state storage media 110; the profiling information may include, but is not limited to: error information (e.g., RBER), performance, wear levels, and so on. In some embodiments, the profiling information may be maintained in the storage metadata 135 and/or may be accessible to the reliability module 120, which may use the profiling information to identify storage resources that should be retired. Alternatively, or in addition, the reliability module 120 may be configured to actively scan and/or test the solid-state storage media 110 to identify storage resources that should be retired.

The OOS management module 160 may be configured to track storage resources that have been taken out of service. In some embodiments, the OOS management module 160 tracks OOS conditions in the solid-state storage media 110 using OOS metadata 137. OOS conditions may be detected and/or tracked at varying levels of granularity; OOS conditions may be tracked and/or maintained by page, logical page, erase block, logical erase blocks, die, chips, planes, and/or according to other storage partitions or divisions. The storage divisions may be configured to reflect the reliability characteristics of storage operations performed on the solid-state storage media 110. The reliability module 120 may be configured to maintain reliability information for storage divisions comprising a plurality of erase blocks, in accordance with the logical storage element 515 and/or logical pages 542 of FIGS. 5A and 5B. The disclosure should not be read as limited in this regard, however, and could be applied to any size and/or organization of non-volatile storage media 110. The storage controller 104 may be configured to manage OOS conditions using one or more of a remapping approach, masking approach, hybrid approach, or the like.

In some embodiments, the storage controller 104 is configured to manage OOS conditions using a "remapping" approach, in which the bus 127 includes addressing information for each solid-state storage element 516 in the logical storage element 515 (e.g., each storage element 516 may receive a respective physical address via the bus 127). The storage controller 104 may leverage the separate addressing information to remap replacements for one or more OOS storage resources from other portions of the solid-state storage media 110. The OOS management module 160 may use remapping to prevent a few OOS erase blocks 530 from taking an entire logical erase block 540 out of service.

The OOS management module 160 may be configured to manage OOS conditions using an "masking approach." in which OOS conditions are managed by masking physical storage units that are OOS (if any). As used herein, masking an OOS storage location, such as an erase block 530, may comprise configuring the write pipeline 240 to inject padding data into the write buffer 244, such that the padding data is mapped to the OOS storage locations on the bus 127 during programming operations. Masking may further comprise configuring the read pipeline 241 to ignore (or otherwise avoid) data read from OOS storage locations during read operations. Masking OOS storage units may reduce the storage capacity and/or effective bandwidth of portions of the logical storage element 515, while allowing the remaining in-service storage divisions 530 to continue in operation. As used herein, padding or masking data refers to any data that is used in place of valid data. Accordingly, padding data may be actively added as a particular data pattern (e.g., ones, zeros, or other patterns) or may be added passively by reusing whatever data is on the bus 127 (or write pipeline 240), allowing portions of the bus 127 to float, or the like.

In some embodiments, the OOS management module 160 is configured to manage OOS conditions using a hybrid approach, in which OOS conditions are managed by masking the OOS storage units (if any), as described above. The masking approach may be used until the number of OOS storage locations reaches a threshold. When the threshold is reached, the storage controller 104 may be configured to implement the bad block remapping approach to replace one or more of the OOS physical storage units from other portions of the solid-state media 110, as described above. OOS storage units for which there are no available replacements may continue to be managed using the masking approach. Further embodiments of apparatus, systems, and methods for managing OOS conditions are disclosed in U.S. patent application Ser. No. 13/354,215, entitled, "Apparatus, System, and Method for Managing Out-of-Service Conditions," filed Jan. 19, 2011, which is hereby incorporated by reference in its entirety.

In the FIG. 3A embodiment, the solid-state media controller 103 may comprise an OOS write module 266 configured to manage OOS conditions in the write pipeline 240 (e.g., remap and/or mask OOS storage resources). During write operations, the OOS write module 266 may be configured to identify storage resources that are OOS using, inter alia, the OOS metadata 137. The OOS write module 266 may access the OOS metadata 137 from the OOS management module 160, an internal metadata storage unit, driver, storage controller 104, or the like. Alternatively, or in addition, the OOS management module 160 may be configured to push OOS metadata 137 to the solid-state media controller 103 via the request receiver module 231 (e.g., OOS metadata 137 may be included with storage requests).

The OOS write module 266 may be configured to manage OOS conditions using one or more of a remapping approach, masking approach, hybrid approach, or the like, as described above. The OOS write module 266 (or other command and control module) may be configured to implement a remapping approach to replace OOS storage resources with other, available storage resources. The remapping approach may comprise identifying other, available storage resources and modifying one or more addresses and/or command signals on the bus 127 to replace OOS storage resources with the identified replacement resources (e.g., using the log storage module 248). The OOS write module 266 may be further configured to implement a masking approach, which may comprise injecting padding data into the write buffer 244 (or other portions of the write pipeline 240), such that the padding data is mapped to the OOS storage resources identified by the OOS metadata 137. The OOS write module 266 may be further configured to implement a hybrid approach, in which the OOS write module 266 masks a threshold number of OOS storage resources, and then implements bad block remapping (where available) thereafter.

The OOS read module 267 may be configured to manage OOS conditions in the read pipeline 241 using one or more of a remapping approach, masking approach, hybrid approach, or the like, as described above. In a bad block remapping approach, the OOS read module 267 may be configured to identify the replacement addresses for OOS storage resources (if any) and set addressing and/or control signals on the bus 127 accordingly (e.g., by use of the log storage module 248). In a masking approach, the OOS read module 267 may be configured to strip (or otherwise ignore) data read corresponding to OOS storage resources (e.g., strip padding data from the read buffer 245 before the data is processed through the rest of the read pipeline 241). In a hybrid approach, the OOS read module 267 may be configured to selectively remap storage resources and/or strip data from the read buffer 245 in accordance with the OOS metadata 137, and as described above.

Figure 3B:
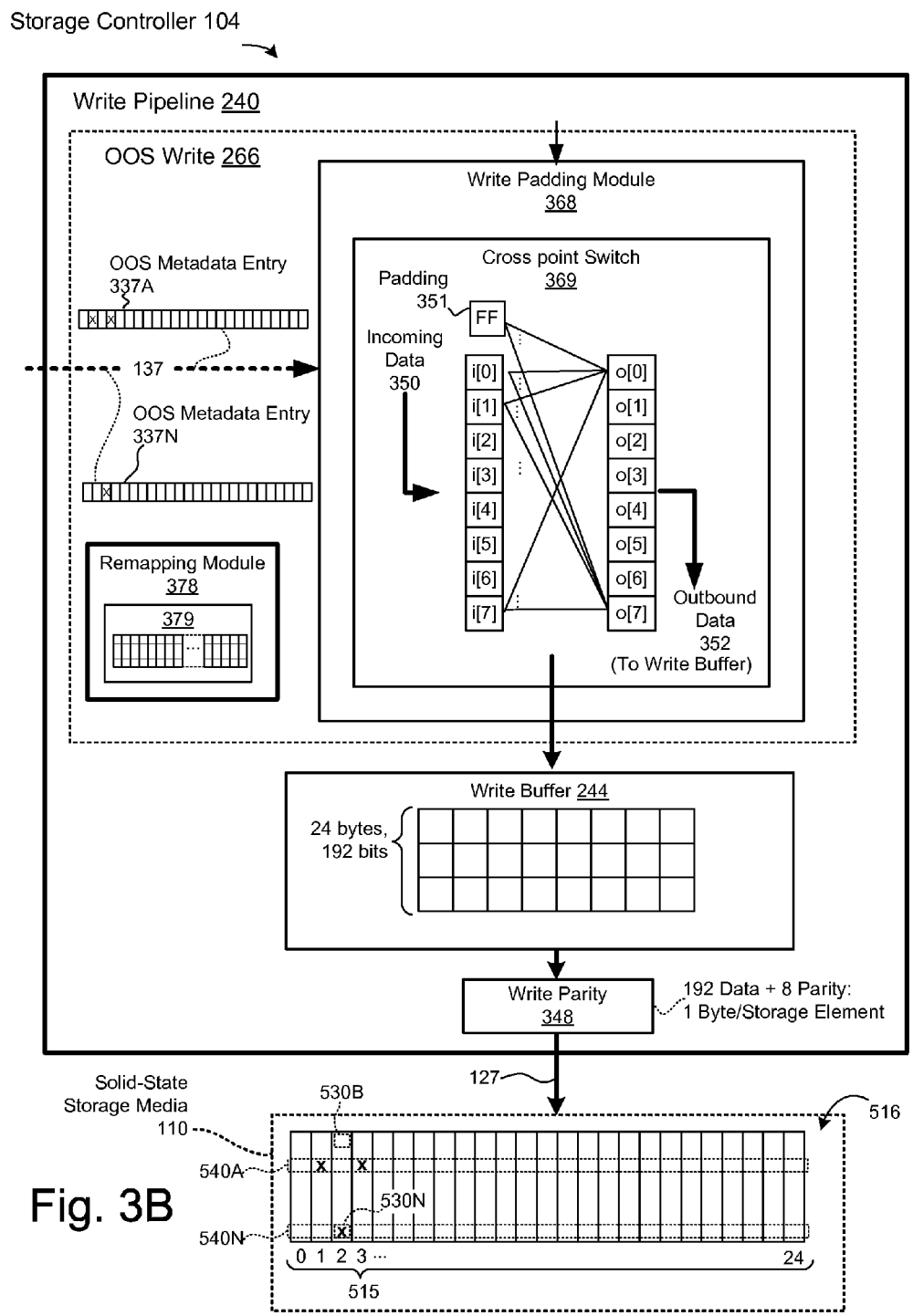
FIG. 3B is a block diagram of another embodiment of a solid-state storage controller.

FIG. 3B depicts another embodiment of a storage controller 104, comprising an OOS write module 266 configured to manage OOS conditions on a solid-state storage media 110. The write pipeline 240 may comprise an OOS write module 266 configured to manage OOS conditions using one or more of a remapping approach, masking approach, and hybrid approach. The FIG. 3B embodiment may comprise an OOS padding module 368 that is configured to mask OOS storage locations using padding data 351. The OOS management module 160 may be configured to maintain OOS metadata 137 pertaining to OOS conditions on the solid-state storage medium 110. The OOS metadata 137 may be maintained at different levels of granularity. In the FIG. 3B embodiment, the OOS metadata 137 may track OOS conditions within respective logical erase blocks 540A-N. The OOS metadata 137 may, therefore, comprise one or more entries 337A-N identifying erase blocks that are OOS (if any). The OOS metadata entries 337A-N may be provided to the OOS write module 266 as data is being written to a particular logical erase block 540A-N. Alternatively, or in addition, the OOS write module 266 may store portions of the OOS metadata 137 (e.g., one or more entries 337A-N) in one or more configuration registers or other storage locations (not shown).

The OOS write module 266 may comprise a write padding module 368 configured to selectively replace incoming data 350 with padding data 351, such that the padding data 351 is mapped to storage locations of OOS erase blocks as identified by a corresponding OOS metadata entry 337A-N. The logical erase blocks 540A-N may comprise twenty five erase blocks (0-24), each on a respective solid-state storage element 516. As illustrated in FIG. 3B, the OOS metadata entry 337A of logical erase block 540A may indicate that erase blocks 1 and 3 are OOS. Accordingly, when writing data to logical erase block 540A, the write padding module 368 may be configured to map padding data 351 to erase blocks 1 and 3 (e.g., by use of the cross point switch 369, or other mechanism). Outbound data 352 may stream from the cross point switch 369 to a the write buffer 244, which may be configured to buffer 24 bytes, one byte for each solid-state storage element 0-24. The write parity module 348 may be configured to calculate a parity byte corresponding to the data 352 (the padding data 351 may be ignored by the write parity module 348 and/or the padding data 351 may be configured to not affect the parity calculation). The output data 352 and parity byte may stream to program buffers of the solid-state storage elements 516 via the bus 127, such that the padding data 351 is streamed to elements 1 and 3.

As illustrated in FIG. 3B, OOS metadata entry 337N of logical erase block 540N may indicate that erase block 2 is OOS (e.g., the erase block on storage element 2 has been retired). In response, the write padding module 368 may be configured to mask erase block 2 with padding data 351, such that the padding data 351 streams to the program buffer of solid-state storage element 2, as described above.

In some embodiments, the OOS write module 266 may implement a remapping approach to managing OOS conditions. The OOS write module 266 may, therefore, comprise a remapping module 378, which may be provided in place of, or in addition to, the OOS padding module 368. The remapping module 378 may be configured to maintain remapping metadata 379, which may comprise addresses of replacement erase blocks that can be used to replace erase blocks that are OOS. The replacement erase blocks may be maintained in one or more dedicated spare areas, may be taken from other logical erase blocks 540A-N, or the like. The remapping module 378 may be configured to remap one or more of the replacement erase blocks of 379 to replace one or more OOS erase blocks in a logical erase block 540A in accordance with the OOS metadata 137, as described above (e.g., per the OOS metadata entries 337A-N). For example, when writing data to logical erase block 540N, the remapping module 378 may be configured to remap erase block 530B to replace the OOS erase block 530N. Remapping the erase block 530B may comprise providing different addressing information to the solid-state storage element 2 (via the bus 127) configured to cause storage element 2 to program the data to erase block 530B rather than erase block 530N. Accordingly, the data 350 may flow to each solid-state storage element 0-24 of logical erase block 540N, without padding data 351. However, when the data is streamed and/or programmed to the logical erase block 540N, the solid-state storage element 2 may be provided with different addressing information than the other solid-state storage elements 516.

The OOS write module 266 may comprise both the write padding module 368 and a remapping module 378. The remapping module 378 may be configured to replace OOS erase blocks when possible. The write padding module 368 may be configured to mask OOS erase blocks for which there are no replacements available with padding data 351, as described above. For example, when writing data to logical erase block 540A, the remapping module 378 may be configured to remap a replacement for the OOS erase block on solid-state storage element 1, and may mask the erase block of solid-state storage element 3 with padding data. The read pipeline 241 may comprise similar modules configured to strip (and/or ignore) data from OOS solid-state storage elements 516 and/or read data from remapped solid-state storage elements 516.

Figure 4A:
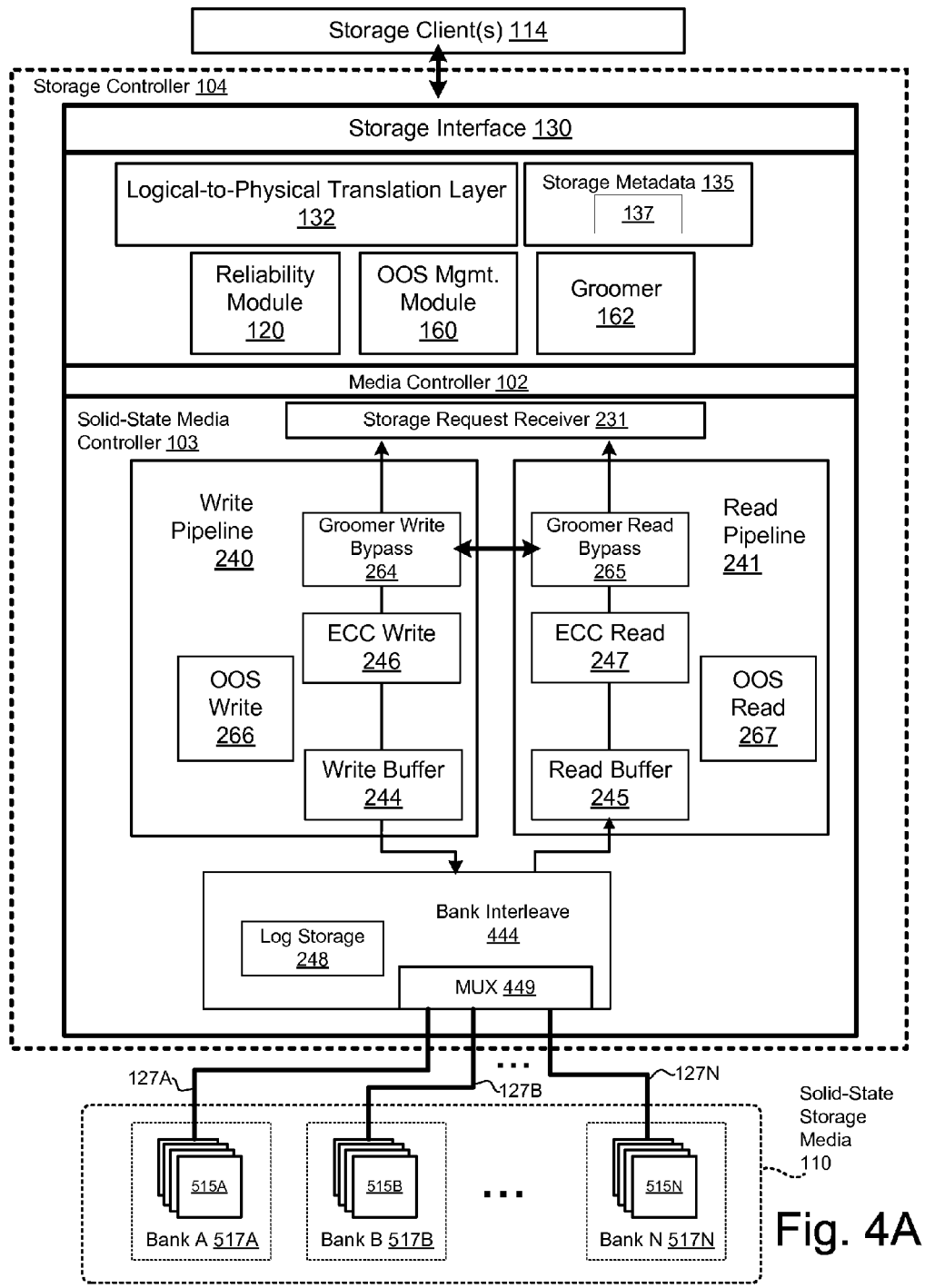
FIG. 4A is a block diagram of another embodiment of a solid-state storage controller.

FIG. 4A depicts another embodiment of a storage controller 104. In the FIG. 4A embodiment, the storage controller 104 is coupled to a plurality of independent banks as disclosed in U.S. patent application Ser. No. 11/952,095, entitled "Apparatus, System, and Method for Managing Commands of Solid-State Storage Using Bank Interleave," filed Dec. 12, 2006, which is hereby incorporated by reference in its entirety. Each bank 517A-N may comprise a respective logical storage element 515A-N, which may be communicatively coupled a bus 127A-N, as described above. The bank interleave module 444 may be configured to sequence storage operations between the banks 517A-N, and may selectively direct command and/or data signals to/from the banks 517A-N using the multiplexer 449 (or other switching mechanism).

The reliability module 120 may be configured to identify storage resources within the banks 517A-N that should be taken out of service, and the OOS management module 160 may be configured to track OOS conditions across each of the banks 517A-N. In some embodiments, the reliability module 120 is configured to monitor storage operations on the banks 517A-N, access profiling data pertaining to storage operations on the banks 517A-N, and/or scan and/or test the banks 517A-N, as described above. The OOS management module 160 may be configured to track OOS conditions using OOS metadata 137, which may comprise entries pertaining to OOS conditions on each of the banks 517A-N. The OOS write module 266 and the OOS read module 267 may be configured to manage OOS conditions within each bank 517A-N in accordance with the OOS metadata 137, as described above.

Figure 5C:
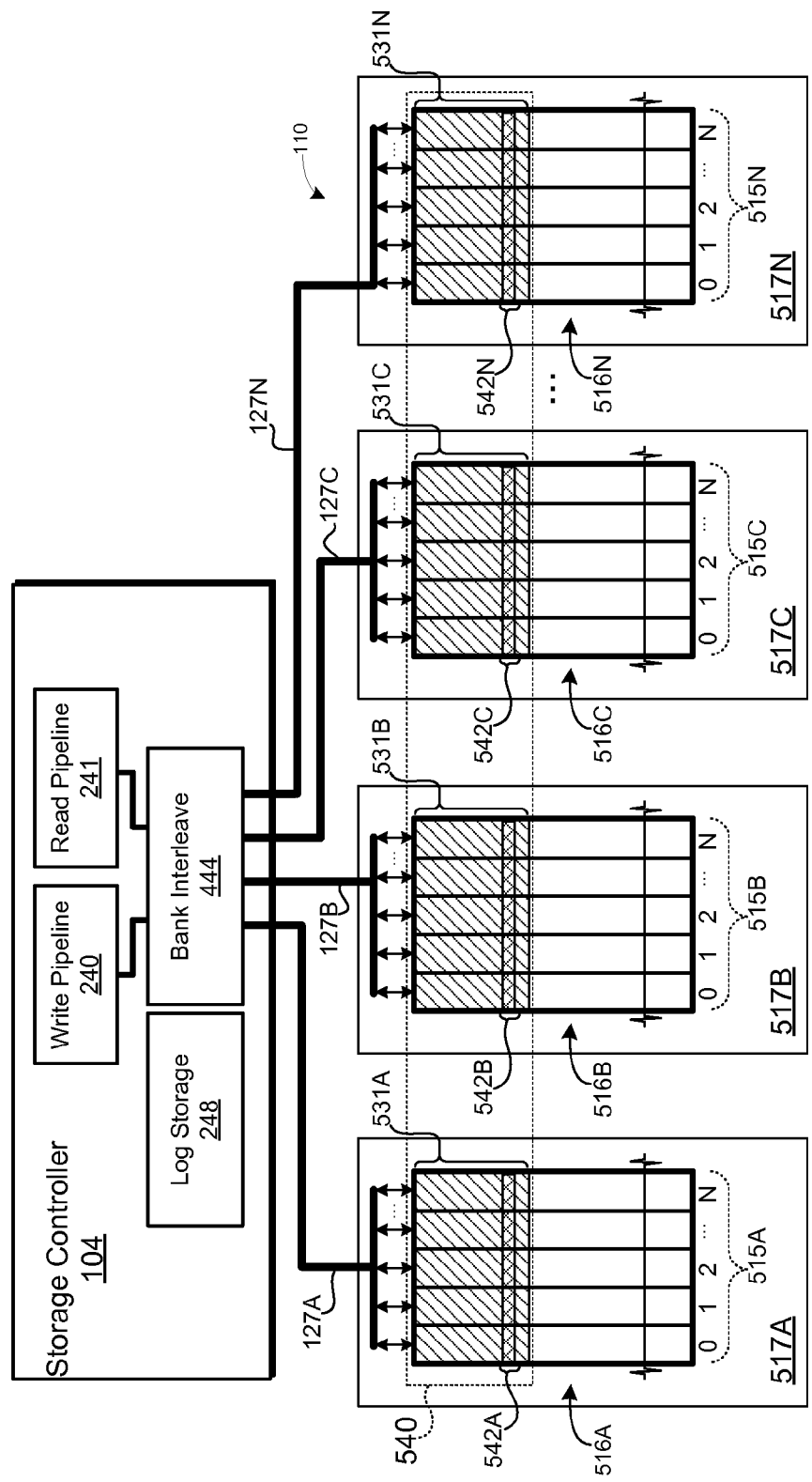
FIG. 5C is a block diagram depicting another embodiment of a logical storage element.

FIG. 5C depicts one embodiment of a storage controller 104 configured to manage logical erase blocks 540 that span multiple banks 517A-N. Each bank 517A-N may comprise one or more logical storage elements 515A-N, which, as disclosed herein, may comprise one or more solid-state storage elements 0-N coupled in parallel to the storage controller 104 by a respective bus 127A-N. Accordingly, the storage controller 104 may be configured to perform storage operations on each bank 517A-N of storage elements 516A-N in parallel and/or in response to a single command and/or signal.

Some operations performed by the storage controller 104 may cross bank boundaries. For example, the storage controller 104 may be configured to manage the solid-state storage media 110 using logical erase blocks 540 that span banks 517A-N. Each logical erase block 540 may comprise a group of erase blocks 531A on each of the banks 517A-N. The groups of erase blocks 531A-N in the logical erase block 540 may be erased together (e.g., in response to a single erase command and/or signal or in response to a plurality of separate erase commands and/or signals). Performing erase operations on larger groups of erase blocks 531A-N may further mask the asymmetric properties of the solid-state storage media 110, as disclosed above.

The storage controller may be configured to perform some storage operations within bank boundaries (e.g., within the boundaries of particular banks 517A-N). In some embodiments, the storage controller 104 may be configured to read, write, and/or program logical pages 542A-N within the respective banks 517A-N. As depicted in FIG. 5C, the logical pages 542A-N may not span banks 517A-N (e.g., each logical page 542A-N may be contained within the logical storage element 515A-N of a respective bank 517A-N). The log storage module 248 and/or bank interleave module 444 may be configured to interleave such storage operations between the banks 517A-N.

Figure 5D:
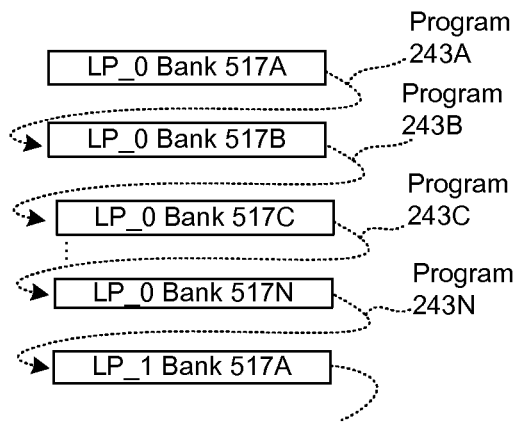
FIG. 5D depicts one embodiment of a bank interleave pattern.

FIG. 5D depicts one embodiment of storage operations that are interleaved between banks 517A-N. In the FIG. 5D embodiment, the bank interleave module 444 is configured to interleave programming operations between logical pages 542A-N of the banks 517A-N depicted in FIG. 5C. As described herein, the write pipeline 240 may comprise a write buffer 244, which may have sufficient capacity to fill one or more logical pages 242A-N. In response to filling the write buffer 244 (e.g., buffering data sufficient to fill a portion of a logical page 242), the storage controller 140 may be configured to stream the contents of the write buffer 244 to one of the banks 517A-N (e.g., to program buffers of the solid-state storage elements of one of the logical storage elements 515A-N). The storage controller 104 may issue a program command and/or signal to the particular logical storage element 515A-N to cause the solid-state storage elements 516A-N to program the data to the corresponding logical page 542A-N. The log storage module 248 and/or bank interleave module 444 may be configured to route the data to the particular bank 517A-N and/or provide addressing data via the bus 127A-N.

The bank interleave module 444 may be configured to program data to logical pages 242A-N within the banks 517A-N in accordance with an interleave pattern. In some embodiments, the interleave pattern is configured to sequentially program data to logical pages 242A-N of the banks 517A-N. In some embodiments, the interleave pattern may comprise programming data to a first logical page (LP_0) of bank 517A, followed by the first logical page of the next bank 517B, and so on, until data is programmed to the first logical page LP_0 of each bank 517A-N. As depicted in FIG. 5D, data may be programmed to the first logical page LP_0 of bank 517A in a program operation 243A. The bank interleave module 444 may then stream data to the first logical page (LP_0) of the next bank 517B. The data may then be programmed to LP_0 of bank 517B in a program operation 243B. Data may be streamed to and programmed on the first logical page LP_0 of bank 517B in a program operation 243B. The program operation 243B may be performed concurrently with the program operation 243A on bank 517A; the storage controller 104 may stream data to bank 517B and/or issue a command and/or signal for the program operation 243B, while the program operation 243A is being performed on bank 517A. Data may be streamed to and/or programmed on the first logical page (LP_0) of the other banks 517C-517N following the same interleave pattern (e.g., after data is streamed and/or programmed to LP_0 of bank 517B, data is streamed and/or programmed to LP_0 of bank 517C in program operation 243C, and so on). Following the programming operation 243N on LP_0 of the last bank 517N, the bank interleave controller 444 may be configured to begin streaming and/or programming data to the next logical page (LP_1) of the first bank 517A, and the interleave pattern may continue accordingly (e.g., program LP_1 of bank 517B, followed by LP_1 of bank 517C through LP_1 of bank 517N, followed by LP_2 of bank 517A, and so on).

Interleaving programming operations as described herein may increase the time between concurrent programming operations on the same bank 517A-N, which may reduce the likelihood that the storage controller 104 will have to stall storage operations while waiting for a programming operation to complete. As disclosed above, programming operations may take significantly longer than other operations, such as read and/or data streaming operations (e.g., operations to stream the contents of the write buffer 244 to a logical storage element 515A-N via the bus 127A-N). The interleave pattern of FIG. 5D avoids consecutive program operations on the same bank 517A-N; programming operations on a particular bank (bank 517A) may be separated by N−1 programming operations on other banks (e.g., programming operations on bank 517A are separated by programming operations on banks 517B-N). Since the interleave pattern of programming operation separates programming operations on 517A by programming operations on banks 517B-N, the programming operation on bank 517A is likely to be complete before another programming operation needs to be performed on the bank 517A.

Figure 5E:
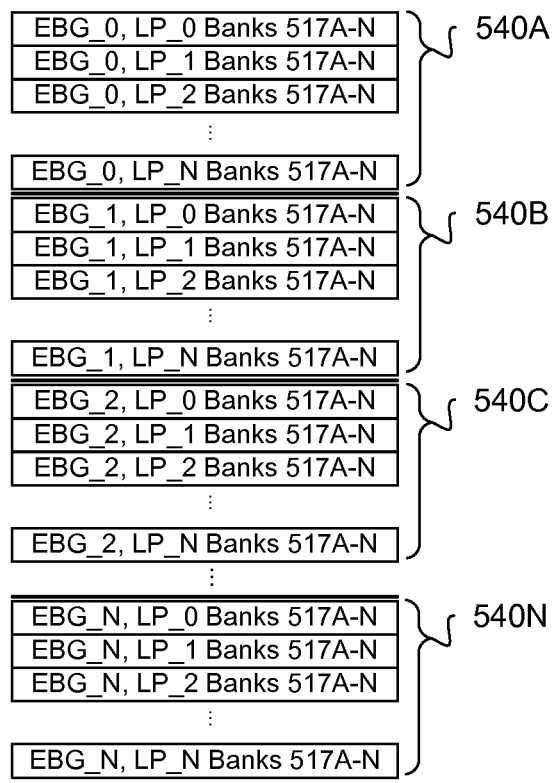
FIG. 5E depicts another embodiment of a bank interleave pattern.

As depicted in FIG. 5D, the interleave pattern for programming operations may comprise programming data sequentially across logical pages 242A-N of a plurality of banks 517A-N. As depicted in FIG. 5E, the interleave pattern may result in interleaving programming operations between banks 517A-N, such that the erase blocks of each bank 517A-N (erase block groups EBG_0-N) are filled at the same rate. The interleave pattern programs data to the logical pages of the first erase block group (EBG_0) in each bank 517A-N before programming data to logical pages LP_0 through LP_N of the next erase block group (EBG_1), and so on (e.g., wherein each erase block comprises 0-N pages). The interleave pattern continues until the last erase block group EBG_N is filled, at which point the interleave pattern continues back at the first erase block group EBG_0.

The erase block groups of the banks 517A-N may, therefore, be managed as logical erase blocks 540A-N that span the banks 517A-N. Referring to FIG. 5C, a logical erase block 540 may comprise groups of erase blocks 241A-N on each of the banks 517A-N. As disclosed above, erasing the logical erase block 540 may comprise erasing each of the erase blocks 241A-N comprising the logical erase block 540. In the FIG. 5E embodiment, erasing the logical erase block 540A may comprise erasing EBG_0 of each bank 517A-N, erasing a logical erase block 540B may comprise EBG_1 of the banks 517A-N, erasing logical erase block 540C may comprise erasing EBG_2 of the banks 517A-N, and erasing logical erase block 540N may comprise erasing EBG_N of the banks 517A-N. Other operations, such as grooming, recovery, and the like may be performed at the granularity of the logical erase blocks 540A-N; recovering the logical erase block 540A may comprise relocating valid data (if any) stored on EBG_0 of the banks 517A-N, erasing the erase blocks of each EBG_0 of the banks 517A-N, and so on. Accordingly, in embodiments comprising four banks 517A-N, each bank 517A-N comprising a logical storage element 515A-N formed of twenty five storage elements 516A-N, erasing, grooming, and/or recovering a logical erase block 540 comprises erasing, grooming, and/or recovering one hundred erase blocks 530. Although particular multi-bank embodiments are described herein, the disclosure is not limited in this regard and could be configured using any multi-bank architecture comprising any number of banks 517A-N having logical storage elements 515A-N comprising any number of solid-state storage elements 516A-N.

Figure 5F:
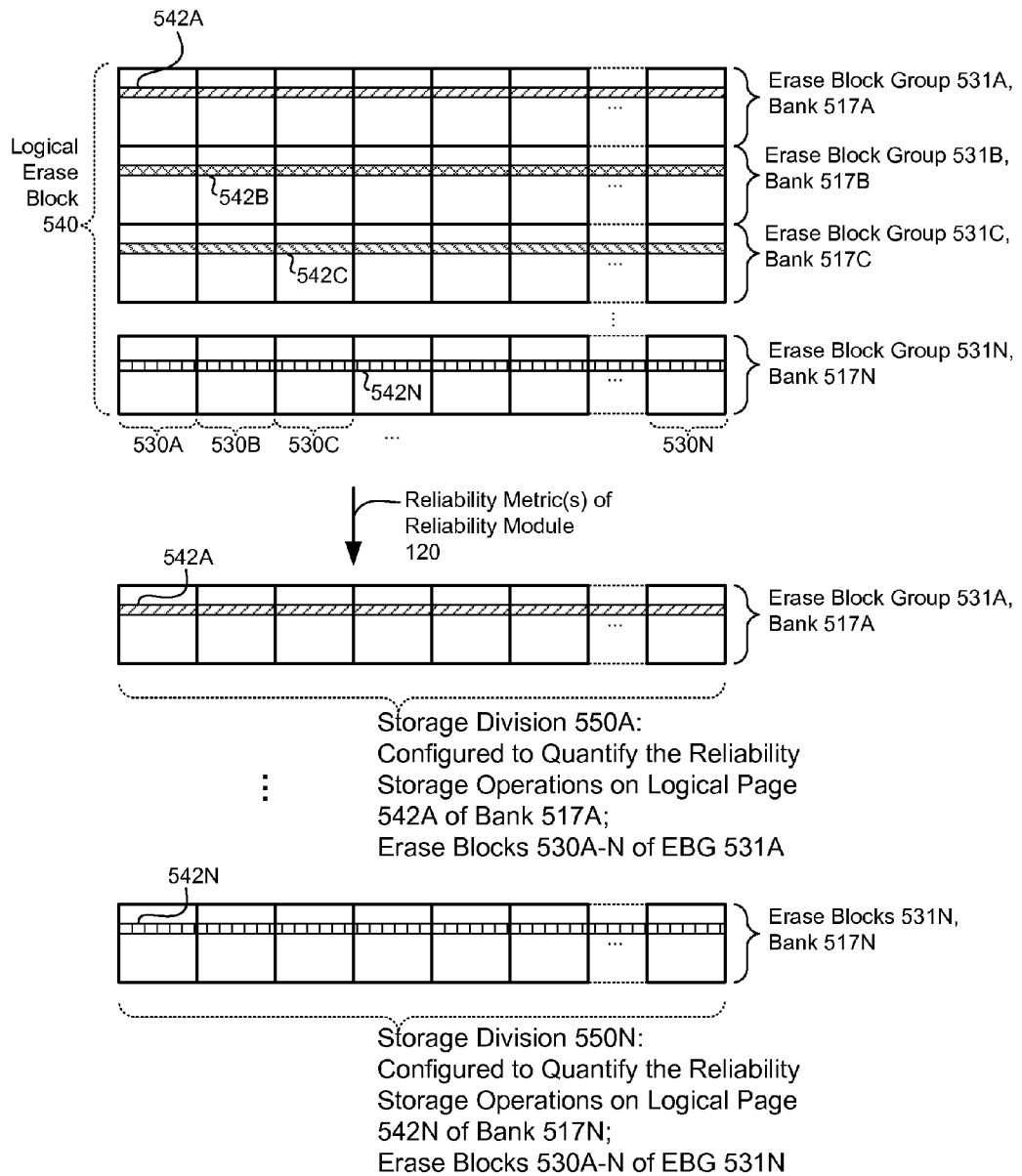
FIG. 5F depicts one embodiment of storage divisions configured according to the granularity of storage operations of a bank interleave pattern.

The reliability module 120 may be configured to track reliability metrics and/or storage retirement in accordance with the granularity of the storage operations performed on the solid-state storage media 110. The granularity of storage operations may differ from other operations and/or partitioning schemes used to manage the solid-state storage media 110. As described above, the storage controller 104 may be configured to erasure, grooming, recovery, and other operations at the granularity of logical erase blocks 540, which span multiple banks 517A-N. As illustrated in FIG. 5F, however, the storage controller 104 may be configured to perform storage operations on logical pages 542A-N that are defined within respective bank boundaries; storage operations on the logical page 542A are performed within bank 517A (e.g., erase blocks 530A-N of group 531A), storage operations on the logical page 542B are performed within bank 517B (e.g., erase blocks 530A-N of group 531B), and so on.

As disclosed above, the reliability module 120 may be configured to maintain reliability metrics and/or retirement metadata in accordance with arbitrarily defined storage divisions 550A-N of the solid-state storage media 110. The storage divisions 550A-N may be configured in accordance with the granularity of the storage operations performed on the solid-state storage media 110 (e.g., read, write, and/or program operations), such that the reliability metrics of the storage divisions 550A-N accurately reflect the reliability characteristics of storage operations performed on the solid-state storage medium 110. Therefore, in the FIG. 5F embodiment, the storage divisions 550A-N may be defined within bank boundaries (in accordance with the boundaries of the logical pages 542A-N): the reliability metric of the storage division 550A may quantify the reliability of the erase blocks 531A of bank 517A (and comprising the logical page 542A), the reliability metric of the storage division 550N may quantify the reliability of the erase blocks 531N of bank 517N (and comprising the logical page 542N), and so on. The difference in granularity between the storage divisions 550A-N used by the reliability module 120 and the logical erase blocks 540 may enable the reliability module 120 to accurately characterize and/or quantify the reliability of storage operations performed on the logical pages 542A-N. For example, if the reliability module were to use a storage division at the granularity of the logical erase blocks 540, the corresponding reliability metric would incorporate the reliability metric of the erase blocks within each bank 517A-N, which would include reliability characteristics of erase blocks not involved in read, write, and/or program operations of individual logical pages 542A-N; e.g., the reliability metric of operations on a logical page 542A would incorporate reliability characteristics of erase blocks in groups 531B-N, which are not involved in storage operations on the logical page 542A and could result in inaccurate reliability assessments; e.g., poor reliability of erase blocks 531B would affect the reliability metric of operations performed on the logical page 542A despite the fact that such operations do not involve bank 517B. However, in embodiments in which storage operations span multiple banks 517A-N, such that the logical pages 542A-N comprise storage units on multiple banks 517A-N, the reliability module 120 may configure the storage divisions 550A-N accordingly (e.g., adapt the storage divisions 550A-N to span multiple banks 517A-N, in accordance with the granularity of the multi-bank logical pages).

Referring to FIG. 4A, the reliability module 120 may be configured to identify portions of the solid-state storage media 110 that should be retired by use of reliability metrics pertaining to storage divisions 550, which may be configured in accordance with the granularity of storage operations performed on the solid-storage media 110. The OOS management module 160 may also be configured to maintain and/or manage OOS conditions at different levels of granularity. The OOS management module 160 is configured to manage OOS conditions at the same granularity as the reliability module 120, which may comprise managing OOS conditions in accordance with the storage divisions 550. Alternatively, the OOS management module 160 may be configured to manage OOS conditions at a different level of granularity. In some embodiments, for example, the OOS management module 160 is configured to manage OOS conditions at a higher level of granularity, such as logical erase blocks 540.

Figure 4B:
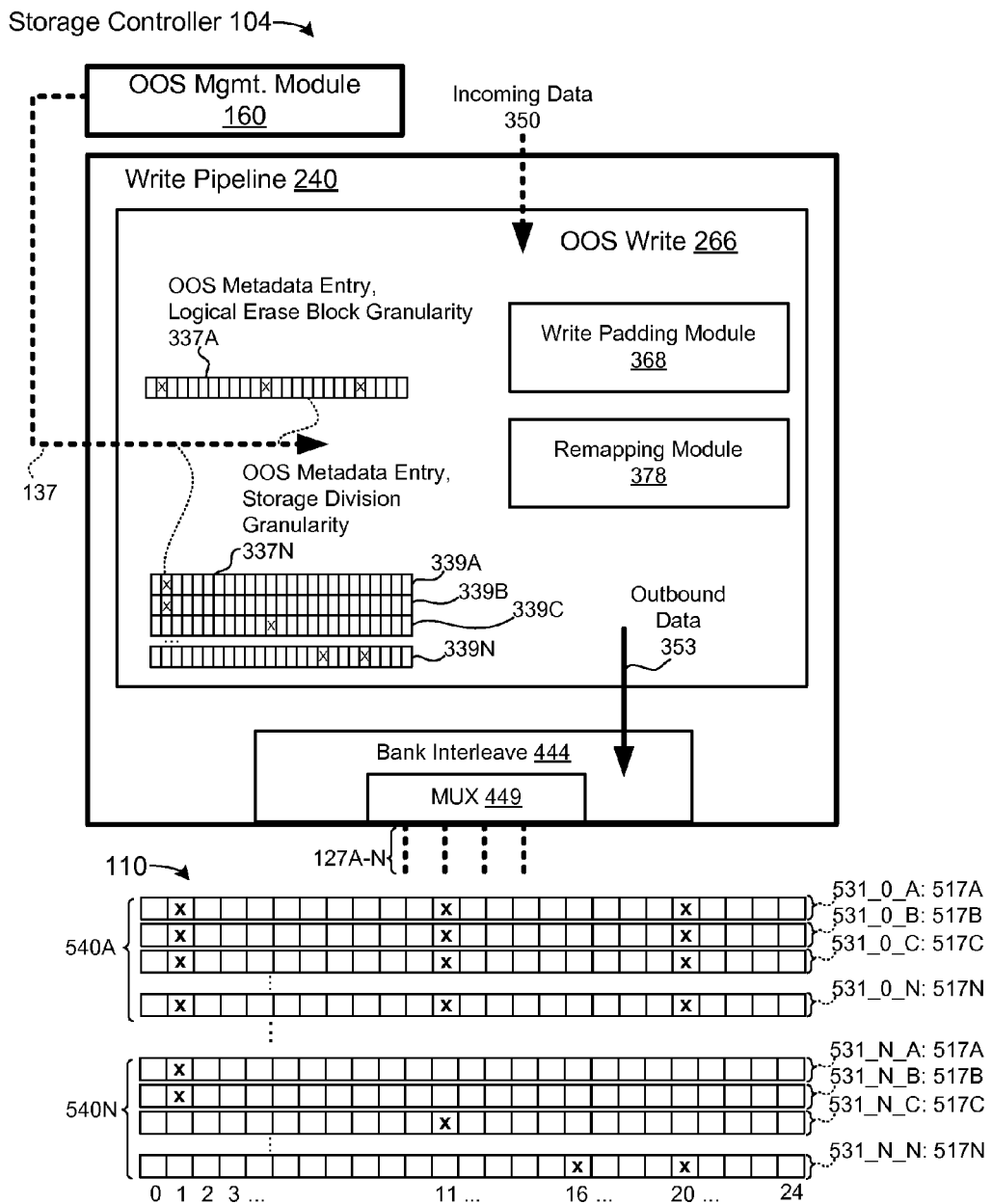
FIG. 4B is a block diagram of another embodiment of a solid-state storage controller.

FIG. 4B is a block diagram of another embodiment of a storage controller 104. The write pipeline 240 may comprise an OOS write module 266 that is configured to manage OOS conditions on the solid-state storage media 110 in accordance with OOS metadata 137 maintained by the OOS module 160 using one or more of a remapping approach, masking approach, hybrid approach, or the like.

As described above, the storage controller 104 may be configured to interleave storage operations between a plurality of banks 517A-N. The storage operations may be performed on logical pages 542A-N within respective banks 517A-N. Other operations, however, may span multiple banks 517A-N. In some embodiments, the storage controller 104 is configured to perform erasure, recovery, and/or grooming operations on logical erase blocks 540A-N, each of which may comprise groups of erase blocks on multiple banks 517A-N; logical erase block 540A may comprise erase block group 0 of banks 517A-N (531_0_A-N), logical erase block 540N may comprise erase block group N of banks 517A-N (531_N_A-N), and so on.

In some embodiments, the OOS management module 160 may be configured to manage OOS conditions at the granularity of the logical erase blocks 540A-N. The OOS metadata entry 337A tracks OOS conditions within the logical erase block 540A. As such, retiring an erase block in any of the banks 517A-N results in treating the corresponding erase block(s) of the other banks 517A-N as being OOS. For example, retiring erase block 1 of bank 517A OOS results in retiring erase block 1 of banks 517B-N, even if the erase blocks in the other banks 517B-N are still sufficiently reliable to remain in service. When writing data to logical pages 542A-N within the logical erase block 540A-N the OOS write module 266 may be configured to apply the same set of OOS conditions to each interleaved storage operations (e.g., the OOS conditions apply to each bank 517A-N). Managing OOS conditions at the granularity of logical erase blocks 540A-N may result in lower OOS management overhead since such entries 337A apply to relatively large portions of the solid-state storage medium 110 and the OOS write module 266 applies the same set of OOS indications to each interleaved storage operation within the logical erase block 540A.

The OOS management module 160 may be configured to manage OOS conditions at other levels of granularity. The OOS management module 160 may maintain a metadata entry 337N configured to track OOS conditions at the level of granularity of the storage divisions 550 used by the reliability module 120, as described above. Accordingly, the entry 337N may comprise indications 339A-N that correspond to OOS conditions within each bank 517A-N in the logical erase block 540N; the indications 339A correspond to erase block group 531_N_A of bank 517A, 339B corresponds to erase block group 531_N_B of bank 517B, 339C corresponds to erase block group 531_N_C of bank 517C, 339N corresponds to erase block group 531_N_N of bank 517N, and so on. Accordingly, the OOS write module 266 may be configured to apply a different set of OOS conditions to each interleaved storage operation within the logical erase block 540N; storage operations on each different bank 517A-N may have different OOS conditions, erase block 1 is treated as OOS when performing storage operations on banks 517A and 517B, but is not when performing operations on banks 517C and 517N, erase block 11 is only treated as OOS when performing storage operations on bank 517C, and erase blocks 16 is only treated as OOS when performing storage operations on bank 517N. Managing OOS conditions at the lower level of granularity may, therefore, enable more efficient use of the solid-state storage media 110. Although particular examples of OOS metadata 137 and/or granularities for tracking and/or managing OOS conditions are disclosed herein, the disclosure is not limited in this regard, and could be adapted to track and/or manage OOS conditions at any suitable level of granularity on the solid-state storage medium 110.

Figure 6A:
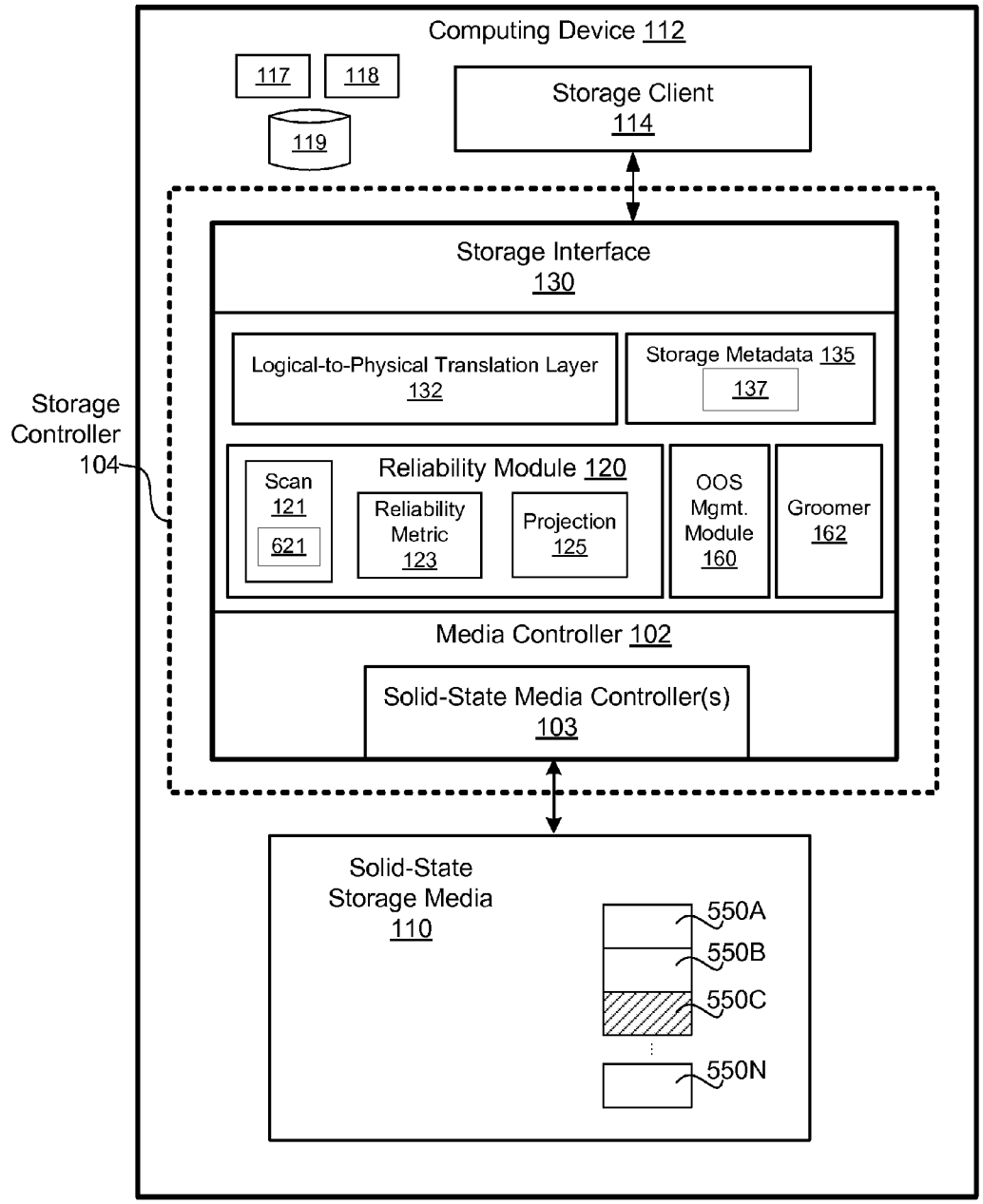
FIG. 6A is a block diagram of one embodiment of a storage controller comprising a reliability module.

FIG. 6A depicts a storage controller 104 comprising a reliability module 120 configured to selectively retire portions of the solid-state storage media 110. The reliability module 120 may monitor the reliability of storage divisions 550A-N, which, as described above, may comprise one or more erase blocks on one or more banks. In some embodiments, identifying a storage division 550A-N for retirement comprises determining a reliability metric of the storage division 550A-N (e.g., the RBER of a storage division 550A-N), projecting the RBER of the storage division 550A-N to the end of a pre-determined, data retention period, and retiring the storage division 550A-N (or portions thereof) in response to determining that the projected RBER does not satisfy a reliability threshold.

The reliability module 120 may be configured to determine the reliability metric of a storage division 550A-N using any suitable measurement and/or monitoring technique. As described above, in some embodiments, the media controller 102 may be configured to maintain error profiling data pertaining to the solid-state storage media 110, and may provide the profiling data to the reliability module 120. The error profiling data may comprise information pertaining to errors detected and/or corrected by the ECC read module 247 and/or by parity substitution (or other reconstruction technique), as described above. The reliability module 120 may use the error profiling data to determine the reliability metric of one or more of the storage divisions 550A-N.

In some embodiments, the reliability module 120 may comprise a scan module 121 configured to perform periodic test read operations on the solid-state storage media 110. A test operation may comprise reading one or more packets and/or data segments from particular storage divisions 550A-N. The test operations may further comprise determining whether the operation(s) resulted in an error (e.g., errors detected and/or corrected using the ECC correction module 322, a parity module, or the like). The reliability module 120 may use error metrics of the test operations to determine and/or estimate the RBER for particular storage divisions 550A-N. The scan module 121 may be configured to perform test operations independently of other storage operations, and may be configured to avoid impacting other storage requests (e.g., may be performed as low-priority, autonomous background operations). The scan module 121 may be configured to periodically test the storage divisions 550A-N to identify portions of the solid-state storage media 110 that should be retired (e.g., perform test operations every five seconds and/or schedule test operations, such that each storage division 550A-N is scanned within a 24-hour period). In some embodiments, the scan module 121 is configured to scan near an append point within the solid-state storage media 110 to reduce the time differential between the time the storage division 550A-N is programmed and the time at which the reliability metric of the storage division 550A-N is determined.

In some embodiments, the scan module 121 may perform test read operations according to a scan pattern. The scan pattern may be configured to alternate read locations within the storage divisions 550A-N. For example, a first test operation may comprise reading a first packet (or first page) of a storage division 550A, a second test operation may comprise reading a second packet (or second page) in another storage division 550B, and so on, until the read locations "wrap" back to the first packet (or page).

In some embodiments, the scan module 121 may comprise scan policy 621, which may configure and/or control the operation of the scan module 121. The scan policy 621 may define a scan pattern to be implemented by the scan module 121, determine a scanning schedule of the scan module 121, determine conditions for triggering the scan module 121 and/or scheduling scan operations, and so on. For example, the scan policy 621 may configure the scan module 121 to scan through the storage divisions 550A-N of the solid-state storage media 121 at a predetermined scanning period, such that each storage division 550A-N is scanned at least once during the scanning period (e.g., at least once per 24 hours). Alternatively, or in addition, the scanning policy may be adaptive in accordance with operating conditions of the storage controller 104 and/or state of the solid-state storage media 110. For example, the scan policy 621 may be configured to increase the frequency of scanning operations in response to determining that the solid-state storage media is becoming less reliable (e.g., overall reliability of the storage divisions 550A-N reaches a particular threshold), has reached a pre-determined wear level, or the like. The scan policy 621 may be stored in volatile memory 118 (with other storage metadata 135), storage 119, the solid-state storage media 110, or in another storage location. The scan policy 621 may be configured according to user preferences, testing and experience, or the like.

The reliability module 120 may further comprise a reliability metric module 123 configured to determine a reliability metric of a storage division 550A-N based, at least in part, on the test read operations performed by the scan module 121 (e.g., based on a raw bit error rate of the test read operations). The reliability metric may also incorporate error profiling data provided by the media controller 102, and so on. The reliability metric module 123 may be configured to determine the reliability metric of a storage division 550 using any suitable error modeling technique and/or mechanism (e.g., RBER, or the like). For example, in some embodiments, the reliability metric module 123 incorporates other factors into the reliability metric of a storage division 550, including, but not limited to: the wear level of the storage division 550A-N (e.g., program/erase cycle count), performance of the storage division 550A-N (e.g., time to program and/or erase), retry count (e.g., number program retries required), and so on.

In some embodiments, the storage controller 104 may be configured to guarantee data availability for a pre-determined, data retention period. As used herein, a "data retention period" refers to the time for which data stored on the solid-state storage media 110 is reasonably guaranteed to be retained, even in the absence of power to the solid-state storage media 110. The data retention period may vary depending on user requirements and/or the capabilities of the solid-state storage media 110. For example, the data retention period may be 90 days, meaning that data stored on the solid-state storage media 110 is reasonably guaranteed to be readable 90 days after being written thereto (even in the absence of power to the solid-state storage media 110).

The reliability module 120 may be configured to manage retirement of storage divisions 550A-N (and/or portions thereof) of the solid-state storage media 110 to ensure that the retention guarantee can be fulfilled. In some embodiments, the reliability module 120 comprises a projection module 125 configured to determine a "projected reliability metric" of the storage division 550A-N. As used herein, a "projected reliability metric" refers to a projection, estimate, forecast and/or prediction of the reliability of a storage division 550A-N at some time in the future. Accordingly, a projected reliability metric may comprise the projected RBER of the storage division 550A-N at the end of a 90-day data retention period. Projecting a reliability metric may, therefore, comprise extrapolating a current reliability metric of particular storage division 550C into some time (T) in the future, such as the end of the data retention period. In some embodiments, the projection may be linear, and as such, calculating a projected reliability metric ($R_{PROJ}$) may comprise scaling a current reliability metric (R) of the storage division 550C by a time-based (T) reliability scaling factor ($P_{REL}$):

$$R_{PROJ} = T * P_{REL} * R$$

The projection module 125 may be configured to calculate the projected reliability metric using a reliability model, which may be configured to model changes in storage division reliability in response to various factors and/or characteristics, which may include, but are not limited to, time, the age of the solid-state storage media 110, operating temperature, erase cycle count, program cycle count, read count, manufacturer specifications, testing and experience, and so on. For example, the projected reliability metric of a particular storage division 550C after the data retention period (T) may be projected based on the retention period guaranteed by the storage controller 104 (e.g., 90 days), the number of times the storage division 550C has been erased, the number of times the storage division 550C has been programmed, the number of times the storage division 550C has been read, manufacturer specifications regarding wear, testing and experience regarding wear, and so on. The projection module 125 may be configured to combine various reliability modeling factors in a weighted combination (e.g., certain factors may weigh more heavily in the projected reliability metric than others). The weights may be determined based on testing and experience, internal feedback loops and/or metrics, manufacturer specifications, and so on. Accordingly, the projection module 125 may be configured to project reliability metrics using a reliability model (RelModel) that incorporates any number of reliability projection factors, which, as described above, may include, but are not limited to: media age (Age), temperature (Temp), erase cycle count (ErC), program cycle count (PrC), read count (RdC), manufacturer specifications (MS), testing and experience (TE), and so on, such that the reliability the storage division 550C projected to a time (T) is:

$$R_{PROJ}(T) = \text{RelModel}(\text{Age, Temp, ErC, PrC, RdC, MS, TE}) * R$$

Moreover, in some embodiments, the projected reliability of a storage division 550A-N may be related to (e.g., a function of) a current reliability of the storage division 550A-N; for example, the rate at which the reliability of the storage divisions 550A-N is projected to change may increase in proportion to the current reliability of the storage divisions 550A-N. Therefore, the reliability model (RelModel) may incorporate the current reliability of the storage division:

$$R_{PROJ}(T) = \text{RelModel}(\text{Age, Temp, ErC, PrC, RdC, MS, TE, R})$$

In some embodiments, the reliability of a storage division 550A-N may be modeled using an exponential decay function, such as:

$$R_{PROJ}(T) = R_0 e^{\lambda t}$$

The initial value ($R_0$) of the exponential delay function may be the current, measured reliability of the storage division 550A-N. The decay factor $\lambda$ may be modeled according to testing and experience (e.g., curve fitting observed reliability data) and/or a reliability model as described above. In another example, reliability may be projected by use of a polynomial spline, or other curve fitting and/or modeling function (e.g., a numerical model), an artificial neural network model, a radial basis function model, or the like, as described above.

The reliability module 120 may be configured to retire storage divisions 550A-N that have a projected reliability metric that does not satisfy a reliability threshold:

$$R_{PROJ}(T) = R_{Threshold} \text{ (Where T is a data retention period)}.$$

In some embodiments, the reliability threshold ($R_{THRESHOLD}$) is based on the error correction strength of the storage controller 104. As used herein, "error correction strength" quantifies the ability of storage controller 104 to detect and/or correct errors in the data stored on the solid-state storage media. The error correction strength may be related to the strength ECC encoding implemented by the storage controller (e.g., the ECC strength), data reconstruction capabilities of parity data associated with data on the solid-state storage media 110, and so on. For example, and as described above, the ECC read module 247 may be capable of correcting a pre-determined number of errors in data read from a storage division 550A-N of the solid-state storage media 110. If the projected RBER of a particular storage division 550C exceeds the number of errors that can be corrected (fails to satisfy the reliability threshold), the reliability module 120 may retire the storage division 550C (take the storage division 550C out of service).

Figure 7A:
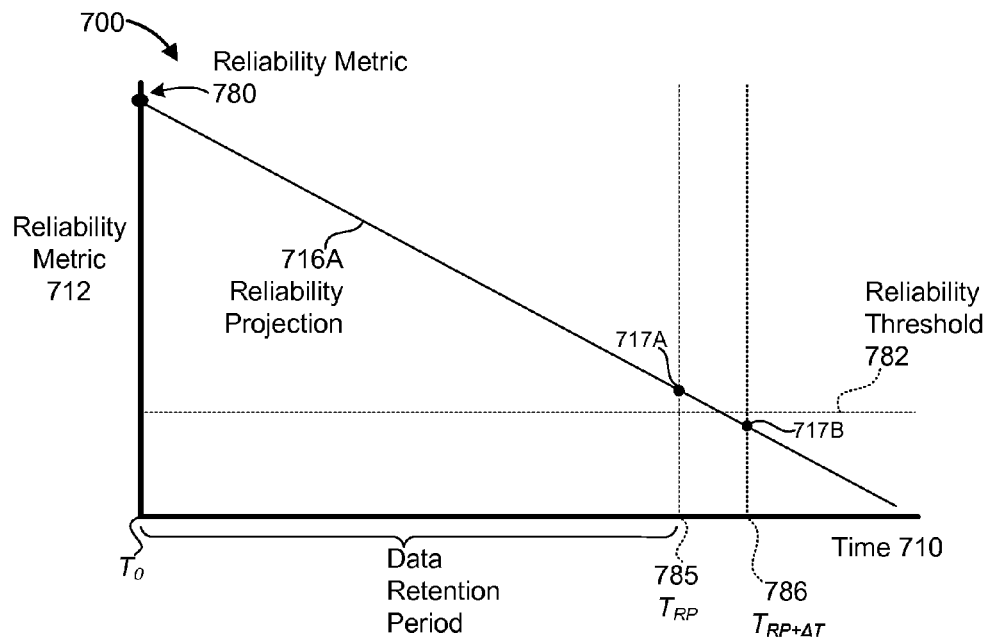
FIG. 7A is a plot depicting one embodiment of a reliability projection.

FIG. 7A is a plot 700 that depicts different embodiments of reliability metric projections. The plot 700 includes a time axis 710 and a reliability metric axis 712. The plot 700 illustrates a reliability metric 780 of a storage division 550A-N. The reliability metric 780 may correspond to a current reliability measurement derived from one or more test read operations, as described above. Accordingly, the reliability metric 780 may be the reliability of the storage division at time $T_0$. The plot 700 depicts one embodiment of a linear reliability metric projection 716A for a storage division 550A-N. As disclosed above, the reliability projection 716A may be a function of time and/or other factors, such as operating conditions, wear level, and so on.

The plot 700 further includes a reliability threshold 782, which, as described above, may correspond to a "minimum" reliability metric at which data can be reliably read from the storage division 550A-N (e.g., the minimum reliability metric at which a data retention guarantee can be reasonably provided). Accordingly, the reliability threshold 782 may correspond to an ECC strength, parity strength, and/or other data reconstruction and/or recovery mechanisms used to protect data stored on the storage division 550A-N. The plot 700 further depicts a predetermined retention period $T_{RP}$ 785, which may correspond to a data retention guarantee.

The reliability module 120 may be configured to retire storage divisions 550A-N that have a projected reliability metric 716A that does not satisfy the reliability threshold 782. Such storage divisions 550A-N may be removed from service since their use is forecast to fail to satisfy the data retention guarantee (e.g., violate the guarantee that data stored on the storage division 550A-N will be readable at the end of the data retention period). This condition is illustrated in FIG. 7A at the intersection 717A of the reliability projection 716A and the end of the reliability period $T_{RP}$ 785 along the time axis 710. The storage division 550A-N corresponding to the reliability projection 716A satisfies the reliability threshold 782 since the reliability projection 717A at $T_{RP}$ 785 is projected to exceed the reliability threshold 782. If, however, the data retention period $T_{RP}$ 785 were increased by ΔT to time 786 (e.g., increased from 90 days to 110 days), the projected reliability 717B of the storage division 550A-N would fail to satisfy the reliability threshold 782 (and the storage division 550A-N may be retired).

Figure 7B:
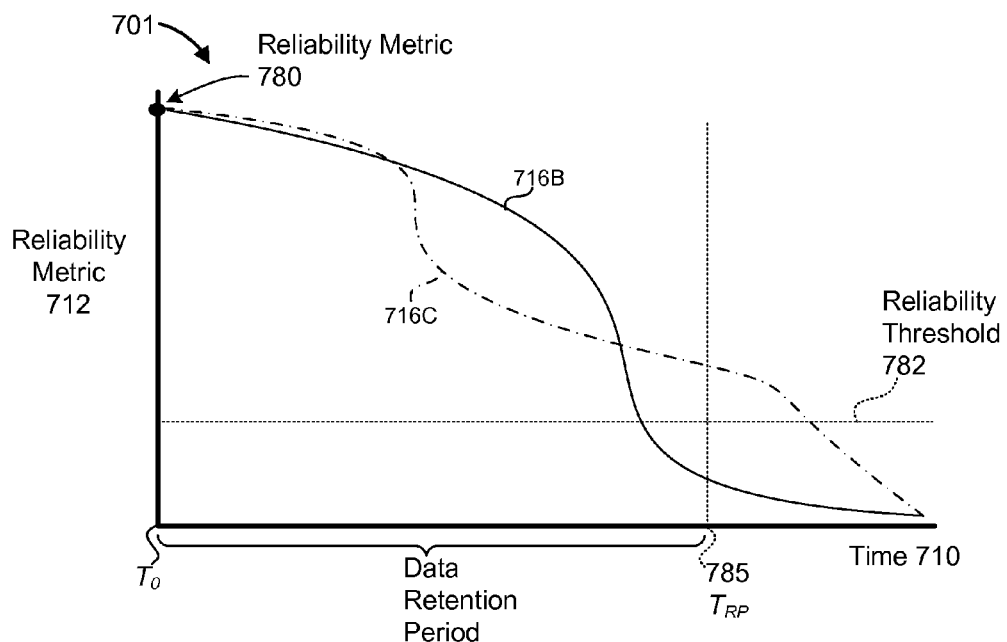
FIG. 7B is a plot depicting other embodiments of reliability projections.

FIG. 7B is a plot 701 depicting other embodiments of reliability projections, including an exponential decay reliability projection 716B and a polynomial (spline) reliability projection 716C. The reliability projections 716B and 716C may correspond to different storage divisions 550A-N, of different solid-state storage media, operating under different conditions, and/or at different wear levels. As illustrated in FIG. 7B, the reliability projection 716B fails to satisfy the reliability threshold 782 when projected to the end of the retention period $T_{RP}$ 785. The reliability projection 716C, however, does satisfy the reliability threshold 782 at time 785. Accordingly, the reliability module 120 may be configured to retire the storage division 550A-N that corresponds to the reliability projection 716B. The reliability module 120 may be further configured to keep the storage division 550A-N that corresponds to the reliability projection 716C in service.

Referring back to FIG. 6A, taking a particular storage division 550C out of service may comprise identifying the retired storage division 550C to the OOS management module 160, so that the storage division 550C is no longer used to store data. The OOS management module 160 may be configured to prevent the media controller 102 from storing data on the storage division 550C, which may comprise marking the storage division 550C as out of service in the OOS metadata 137, remapping a replacement(s) for the storage division 550C, masking the storage division 550C, and so on, as described herein. In addition, the groomer module 162 may be configured to relocate data stored on the OOS storage division 550C to other storage division(s) 550 on the solid-state storage media 110 in a grooming operation, as described above.

Figure 6B:
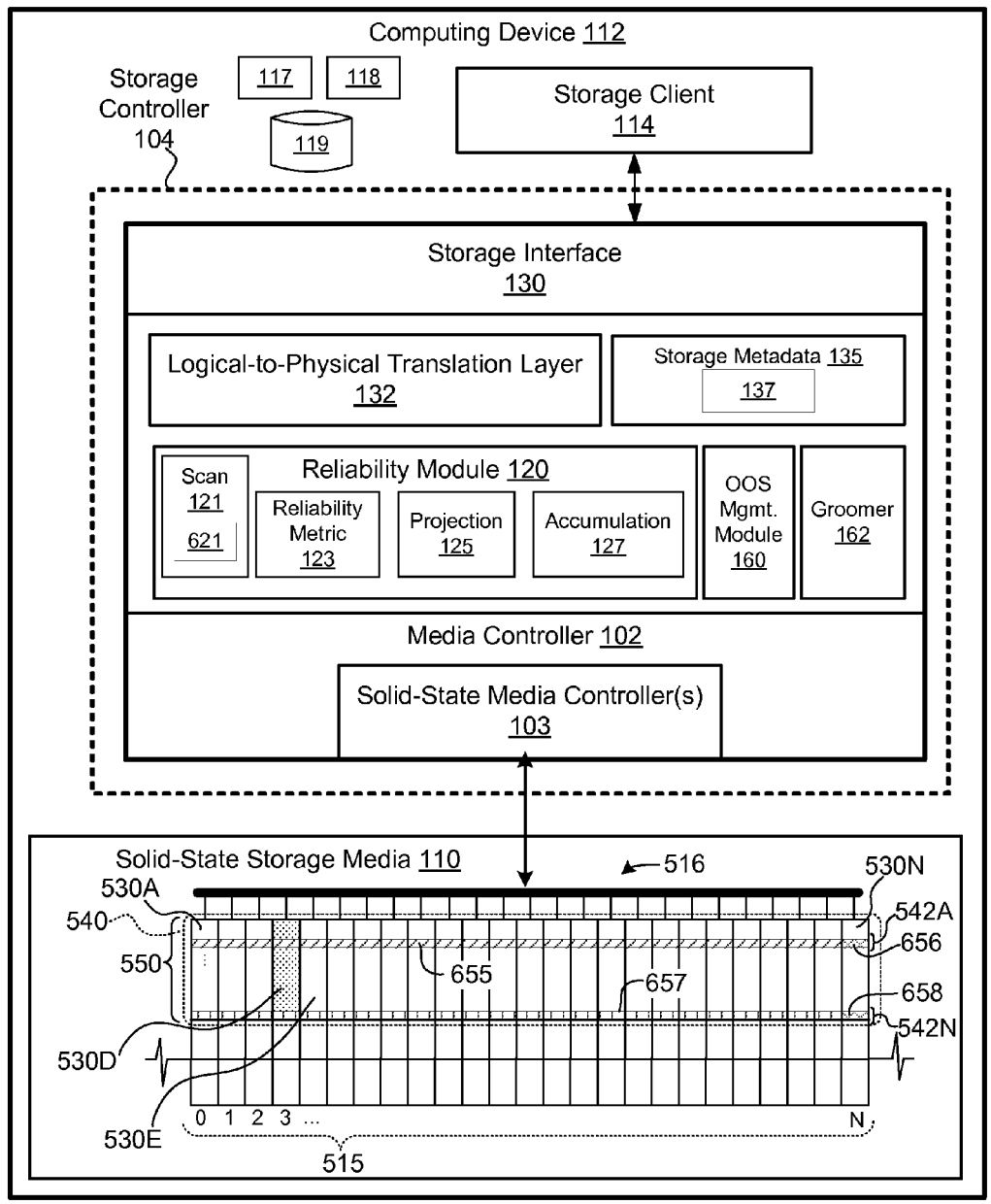
FIG. 6B is a block diagram of another embodiment of a storage controller comprising a reliability module.

FIG. 6B depicts another embodiment 601 of a storage controller 104 comprising a reliability module 120. In the FIG. 6B embodiment, the solid-state storage media 110 comprises a plurality of solid-state storage elements 516 arranged in parallel to form a logical storage element 515. The storage controller 104 may be configured to store data on logical pages 542A-N of the logical erase blocks 540, as described above. Each logical erase block 540 may comprise a plurality of erase blocks 530A-N (e.g., twenty-five erase blocks 530A-N, each on a respective one of the solid-state storage elements 516).

The reliability module 120 may be configured to identify portions of the storage media 110 that should be retired. As disclosed above, the reliability module 120 may be configured to determine the reliability of storage divisions 550, which may be configured in accordance with the granularity of storage operations performed by the storage controller 104. In the FIG. 6B embodiment, the storage divisions 550 correspond to the logical erase blocks 540.

The reliability metric of a storage division 550 may be based on the results of test read operations (performed by the scan module 121), profiling data, and so on, as described above. Determining the reliability metric of a storage division 550 may comprise determining the reliability metric of the erase blocks 530A-N comprising the storage division 550 (e.g., the erase blocks 530A-N of the logical erase block 540). The scan module 121 may be configured to perform one or more test read operations on logical pages 542A-N within the storage division 550. The reliability metric module 123 (and/or the scan module 121) may be configured to attribute errors encountered in the one or more test read operations (and/or profiling data) to respective erase blocks 530A-N (e.g., identify which storage division 550 caused which error(s)), from which a reliability metric of the erase block 530A-N may be determined.

As described above, the storage controller 104 may be configured to encode data into ECC codewords for storage on the solid-state storage medium 110 (e.g., by use of the ECC write module 246). As illustrated in FIG. 6B, an ECC codeword 655 may be stored on a logical page 542A, which may comprise storing portions of the ECC codeword 655 on each of a plurality of erase blocks 530A-N. Accordingly, errors in the ECC codeword 655 may be attributable to one or more different erase blocks 530A-N. In some embodiments, the reliability module 120 is configured to determine the source of each test read error (e.g., identify which storage division 550 caused the error), such that reliability metrics for the individual erase blocks 530A-N can be accurately determined. For example, in some embodiments, the test read operations of the scan module 121 may comprise identifying and/or correcting read errors in the ECC codeword 655 using, inter alia, the ECC read module 247, as described above. The reliability module 120 may use the ECC error identification and/or correction information to attribute test read errors to particular erase blocks 530A-N.

In some embodiments, the ECC codeword 655 may be associated with parity data 656. The parity data 656 may be used to reconstruct portions of the ECC codeword 655 that cannot be corrected by use of the ECC read module 247 (e.g., via parity substitution, or other parity reconstruction technique, as described above). The reliability module 120 may be configured to determine the source of uncorrectable ECC errors (if any) based on the parity correction.

In another example, the storage controller 104 may be configured to encode data using a symbolic ECC encoding, in which data is encoded as a plurality of ECC symbols 657. The ECC symbols 657 may be configured to be stored within pre-determined storage boundaries of the respective erase blocks 530A-N (e.g., each ECC symbol 657 may be configured to be stored on a page of a respective one of the erase blocks 530A-N). Accordingly, the source of ECC read errors may be determined as ECC symbol errors (if any) are detected and/or corrected. ECC symbol data 657 may further comprise parity data 658, which may be used to reconstruct ECC symbols 657 comprising unrecoverable errors, as described above (e.g., using parity substitution, or the like). As described above, parity reconstruction using the parity data 658 may comprise identifying the source of the unrecoverable error(s).

The reliability metric module 123 may be configured to use the results of the test read operations (and/or other profiling data) to calculate respective reliability metrics of the erase blocks 530A-N of the storage division 550. Accordingly, the reliability metric module 123 may be configured to identify errors attributable to each erase block 530A-N (based on ECC and/or parity processing, as described above), and to calculate a respective reliability metric for each erase block 530A-N based on the errors attributed thereto.

The projection module 125 may be configured to project the reliability metric of each erase block 530A-N to the end of a data retention period $T_{RP}$ 785, as described above.

The reliability module 120 may further comprise an accumulation module 127 configured to determine the projected reliability metric of the storage division 550 based on the individual, projected reliability metrics of the erase blocks 530A-N. As described above, reading data from a logical page 542A-N (e.g., storage division 550) may comprise reading data from each of the erase blocks 530A-N comprising the storage division 550. Accordingly, the projected reliability metric of the storage division 550 ($R_{PROJ\_SD}$) may be based on the projected reliability metrics of each of the erase blocks 530A-N in the storage division 550 ($R_{PROJ\_1}$ through $R_{PROJ\_N}$). In some embodiments, the projected reliability metric of the storage division 550 ($R_{PROJ\_SD}$) may comprise an average of the projected reliability metrics of the erase blocks 530A-N ($R_{PROJ\_1}$ through $R_{PROJ\_N}$), as follows:

$$R_{PROJ\_SD} = 1/N \Sigma_1^N R_{PROj\_N}$$

The reliability module 120 may determine whether the projected reliability of the storage division 550 satisfies the reliability threshold 782, which as discussed above, may be based on the error correcting strength of the solid-state storage controller 104. If the projected reliability metric fails to satisfy the reliability threshold 782 (e.g., $R_{PROJ\_SD} < R_{THRESHOLD}$), the reliability module 120 may be configured to retire one or more of the erase blocks 530A-N of the storage division 550. The reliability module 120 may select the erase block(s) 530A-N with the lowest or worst reliability metric (e.g., highest projected RBER) for retirement. The reliability module 120 may remove erase blocks 530A-N until the projected reliability metric of the storage division 550 satisfies the reliability threshold 782 (e.g., the accumulated reliability metric of the remaining erase blocks 530A-N satisfies the threshold 782). For example, if erase blocks 1 and 3 are retired, the new projected reliability metric of the storage division 550 is calculated as:

$$R_{PROJ\_SD} = \frac{1}{N-2} \sum_{2,4-N} R_{PROJ\_N}$$

In some embodiments, the reliability module 120 may take the storage division 550 out of service if more than a threshold number of erase blocks 530A-N must be removed to satisfy the reliability threshold 782 (and/or if the reliability threshold cannot be satisfied by removing erase blocks 530A-N). Alternatively, or in addition, the reliability module 120 may be configured to replace one or more of the erase blocks 530A-N to improve the projected reliability metric of the storage division 550 (e.g., in a remapping approach, as described above). In the remapping approach, an updated projected reliability metric of the storage division 550 may be calculated by incorporating projected reliability metrics of the replacement erase blocks into the accumulated projected reliability metric, as described above.

In some embodiments, the reliability module 120 may retire one or more erase blocks 530A-N, even if the accumulated projected reliability metric of the storage division 550 satisfies the reliability threshold 782. For example, the reliability metric of a particular storage division 550 may be below a retention threshold. The retention threshold may be a minimal threshold for inclusion in a storage division 550. The retention threshold may be less stringent than the reliability threshold 782, described above. For example, a particular erase block 540E of the storage division 550 may have an RBER that is very high (e.g., indicates that the storage division 530D has failed, or is about to fail). However, the other erase blocks 530A-C and E-N may have high reliability metrics, such that the accumulated reliability metric of the storage division 550 satisfies the reliability threshold 782. Notwithstanding, inclusion of the unreliable erase block 530D may adversely affect performance; storage operations involving the erase block 530D may require time-consuming ECC correction and/or parity substitution operations. As such, the reliability module 120 may be configured to retire the erase block 530D in response to determining that the erase block 530D fails to satisfy the minimal retention threshold, despite the fact that the accumulated projected reliability metric of the storage division 550 satisfies the reliability threshold 782.

The reliability module 120 may identify and/or mark storage division(s) 550 (and/or individual erase blocks 530A-N) that should be retired. The reliability module 120 may be configured to identify such storage divisions 550 to the OOS management module 160, which may be configured to take the identified storage divisions OOS, as described above. As disclosed above, the OOS management module 160 may be configured to maintain OOS metadata 137 (e.g., bad block metadata) that identifies OOS storage divisions, such that the OOS storage divisions can be avoided, ignored, and/or remapped (replaced) by use of one or more of a remapping approach, masking approach, hybrid approach, or the like. Although particular examples of mechanisms for managing OOS storage divisions 550 are disclosed herein, the disclosure is not limited in this regard, and could be adapted to manage OOS storage divisions 550 using any suitable mechanism and/or technique. Retiring a storage division 550 may further comprise configuring the groomer module 162 to relocate valid data from the OOS stored division(s) 550 (if any), as described above.

The reliability of the solid-state storage media 110 may decrease over time. Moreover, reliability may be affected by operations performed on neighboring portions of the solid-state storage media 110, such as, inter alia, operating conditions (e.g., read disturb, write disturb, erase disturb), media characteristics (e.g., charge gain, charge loss, de-trapping, etc.), and so on. As such, determining the reliability metric for a storage division 550 when "aged" or "stale" data is on the storage division 550 may result in inaccurate results; a storage division 550 comprising aged data may appear to be less reliable than a storage division 550 comprising data that was recently programmed (e.g., programmed to the storage division 550 within the age threshold). Therefore, it may be more accurate to evaluate the reliability of a storage division 550 when the storage division 550 satisfies an age threshold (e.g., the storage division 550 was recently programmed). As used herein, the "data age" refers to the length of time data has remained on a storage division 550 (e.g., the time that has passed since the data was programmed onto the storage division 550). As used herein, an "age threshold" refers to a time threshold pertaining to data age and/or the last programming time of a storage division 550. Accordingly, an age threshold $T_{AT}$ may relate to the time differential $\Delta T_{D\_Age}$ between the programming time $T_P$ of the storage division 550 and the time that the reliability of the storage division 550 was measured $T_{RM}$ (e.g., the time at which the test read operations were performed on the storage division 550 to determine the reliability metric of the storage division 550).

$$\Delta T_{D\_Age} = T_{RM} - T_P$$

As used herein, an "aged storage division" refers to a storage division 550 having programming time differential $\Delta T_{D\_Age}$ that that exceeds the age threshold $T_{AT}$, such that data stored on the storage division 550 exceeds the age threshold $T_{AT}$ (e.g., is older than the age threshold age threshold TAT). A "non-aged" storage division refers to a storage division 550 having a programming time differential $\Delta T_{D\_Age}$ that is less than the age threshold $T_{AT}$, such that the data has been stored on the storage division 550 for less than the age threshold $T_{AT}$ (e.g., is younger than the age threshold $T_{AT}$):

$$\text{Aged} \leftarrow \Delta T_{D\_Age} \geq T_{AT}, \text{ or Aged} \leftarrow (T_{RM} - T_P) \geq T_{AT}$$

The age threshold $T_{AT}$ may be set in accordance with the reliability model of the storage division 550, testing an experience, or the like. In some embodiments the age threshold $T_{AT}$ is 24 hours, such that storage divisions 550 programmed more than 24 hours before reliability testing would be considered to be aged storage divisions 550. The age of a storage division 550 may be based on one or more of a last program time of a storage division 550, a sequence indicator and/or timestamp, a log-order of a storage division 550, a system clock indicator, storage metadata, or the like.

Figure 7C:
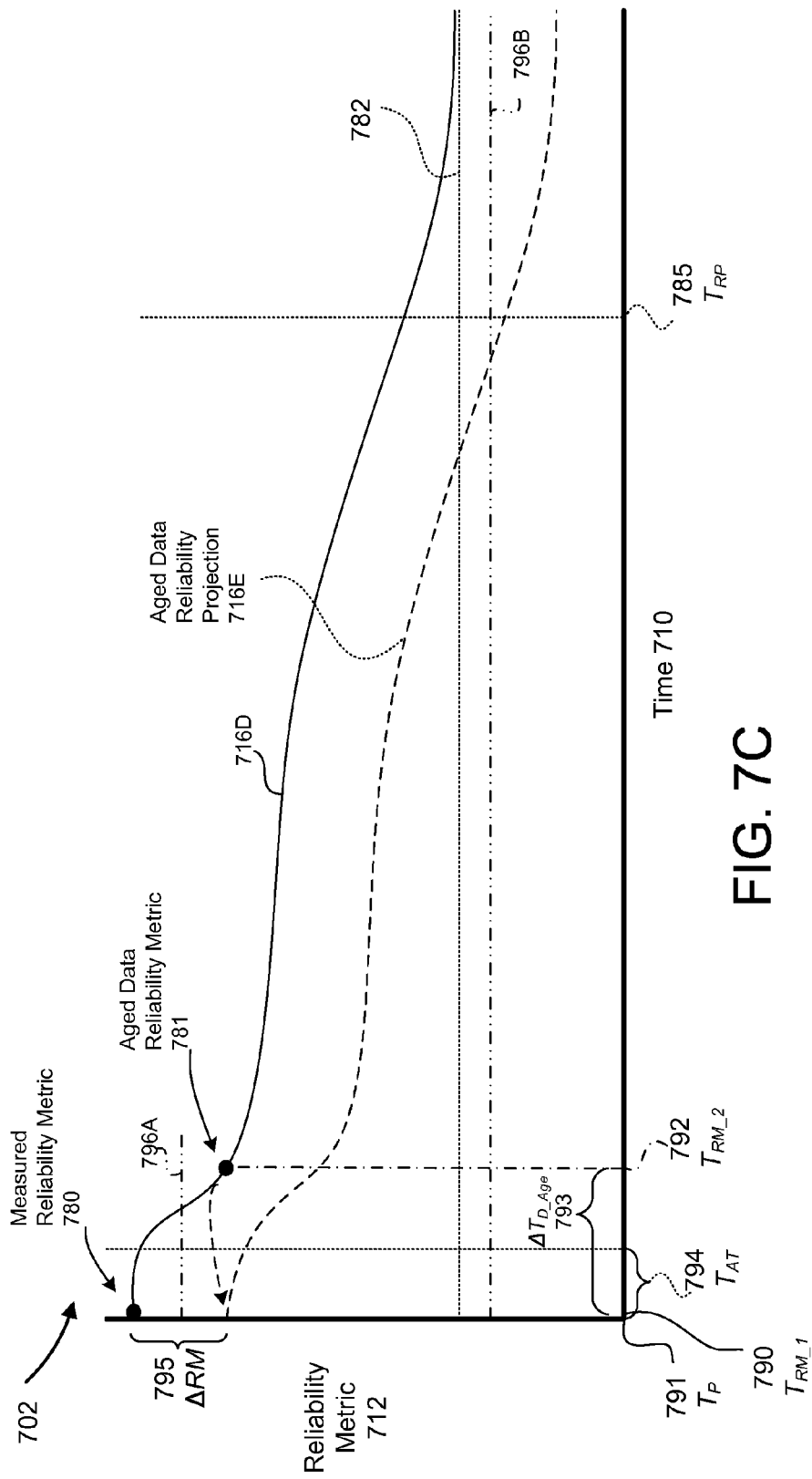
FIG. 7C is a plot depicting other embodiments of reliability projections, including an aged data reliability projection.

FIG. 7C is a plot 702 that depicts further embodiments of reliability projections. The plot 702 illustrates potential inaccuracies in storage division retirement due to, inter alia, data aging conditions. The reliability projection 716D may correspond to the projected reliability of a storage division 550. The reliability projection 716D may be based on a reliability metric 780 that was determined at a time $T_{RM\_1}$ 792 following programming the storage division 550 at time $T_P$ 791. As illustrated in FIG. 7C, the reliability metric 780 was determined shortly after the programming time $T_P$ 791 (e.g., within an hour of the programming time $T_P$ 791).

The projection module 125 may be configured to determine the reliability projection 716D for the storage division 550 based on the reliability metric 780 determined at $T_{RM\_1}$ 792. As depicted in FIG. 7C, the reliability projection 716D indicates that the storage division 550 is projected to satisfy the reliability threshold 782 at the end of the data retention period $T_{RP}$ 785. Based on the reliability projection 716D, the reliability module 120 may keep the storage division 550 in service.

As disclosed above, the reliability module 120 may be configured to scan the solid-state storage media 110 in a particular scan pattern and/or by use of background test read operations. As such, time may pass between the programming time $T_P$ 791 and the time the reliability metric for the storage division 550 is determined (e.g., the time the test read operations, and/or other scanning operations are performed), during which the reliability of the storage division 550 may degrade, as described above. Accordingly, an "aged data" reliability metric 781 determined at time $T_{RM\_2}$ 792 may not accurately reflect the reliability of the storage division 550; the aged data reliability metric 781 may incorporate reliability degradation that occurred during $\Delta T_{D\_Age}$ 793, which may include the time between the program time $T_P$ 791 and the time $T_{RM\_2}$ 792 the reliability metric 781 was determined (e.g., the time the test read operations used to determine the reliability metric 781 were performed). The aged data reliability metric 781 may also reflect non-deterministic reliability degradation due to, inter alia, read disturb, write disturb, and so on, which may vary depending upon usage patterns during $\Delta T_{D\_Age}$ 793. The aged data reliability metric 781 is depicted on the reliability projection 716D to illustrate one embodiment of an aged data reliability differential $\Delta_{RM}$ 795 due to reliability degradation during $\Delta T_{D\_Age}$ 793. Although FIG. 7C indicates that the reliability projection 716C accurately predicted the aged data reliability metric 781 (the aged data reliability metric 781 falls on the reliability projection 716D), this may not always be the case due to, inter alia, non-deterministic and/or other factors affecting storage division reliability 550, has described herein.

Using an aged data reliability metric 781 to determine whether to retire the storage division 550 may yield inaccurate results. FIG. 7C depicts an aged data reliability projection 716E based on the aged data reliability metric 781. The aged data reliability projection 716E indicates that the storage division 550 should be retired; the reliability projection 716E indicates that the storage division 550 is not projected to satisfy the reliability threshold 782 at the end of the data retention period $T_{RP}$ 785. However, as described above, the poor, aged data reliability projection 716E may be due to the time differential $\Delta T_{D\_Age}$ 793 as opposed to actual reliability issues with the storage division 550. For example, in the FIG. 7C embodiment, the aged data reliability projection 716E is tantamount to projecting the reliability beyond the data retention threshold 785 $T_{RP}$ (e.g., time shifting the reliability projection to span from $T_P$ 791 to $T_{RP}$ 785+$T_{RM\_2}$ 792).

In some embodiments, the projection module 120 may be configured to correct the aged data reliability projection 716E, which may comprise time shifting and/or curve fitting the reliability projection 716E in accordance with the reliability model and the time differential $\Delta T_{D\_Age}$ 793. The correction may result in generating the reliability projection 716D based on the aged data reliability metric 781. As depicted in FIG. 3C, the corrected reliability projection may comprise fitting the aged data reliability metric 781 to the reliability projection 716E.

Alternatively, or in addition, the reliability module 120 may be configured to include data age when evaluating storage divisions 550 for retirement. The reliability module 120 may be configured to evaluate aged storage divisions differently than non-aged storage divisions. In some embodiments, the reliability module 120 is configured to defer retirement decisions pertaining to aged storage divisions 550, involving aged data reliability metrics 781 and/or projections 716E, or the like. In some embodiments, the reliability module 120 may be configured to incorporate an age threshold $T_{AT}$ 794 into retirement evaluation. As disclosed above, an aged storage division refers to a storage division 550 comprising data older than the age threshold $T_{AT}$ 794 (e.g., the differential $\Delta T_{D\_Age}$ between the programming time $T_P$ of the storage division 550 and the time that the reliability of the storage division 550 was measured $T_{RM\_2}$ 792 exceeds the age threshold $T_{AT}$ 794).

The age threshold $T_{AT}$ 794 may be based on one or more of the reliability model, configuration, user preferences, testing and experience, or the like. The age threshold $T_{AT}$ 794 may be configured such that reliability measurements made within the time window defined by the age threshold $T_{AT}$ 794, the time window from the programming time $T_P$ 791 and the age threshold $T_{AT}$ 794, satisfy one or more statistical and/or stability criteria (e.g., do not deviate by more than a threshold). For example, as depicted in FIG. 7C, the age threshold $T_{AT}$ 794 may be configured to include a stable portion of the reliability projection 716E and to cut-off before reaching less stable, higher rate-of-change portions.

In some embodiments, the reliability module 120 may be configured to retire non-aged storage divisions 550 based on a reliability metric 780 and/or reliability projection 716E, as disclosed herein. The reliability module 120 may be configured to defer retirement decisions pertaining to aged storage divisions 550. Accordingly, an aged storage division 550 may not be retired even if the storage division 550 is projected to fail the reliability threshold 782. Aged storage divisions 550 that exhibit poor reliability may be marked for subsequent testing, which may comprise grooming the storage division 550, writing data to the storage division 550, and determining a post-write reliability metric of the storage division 550. A storage division 550 having an aged data reliability projection 716E that fails to satisfy an aged data reliability threshold 796A and/or is projected to fail an aged data reliability threshold 796B may be marked for post-write reliability testing. The aged data reliability threshold 796B may be the same as the reliability threshold 782 or, as depicted in FIG. 7C, may differ from the reliability threshold 782.

Figure 6C:
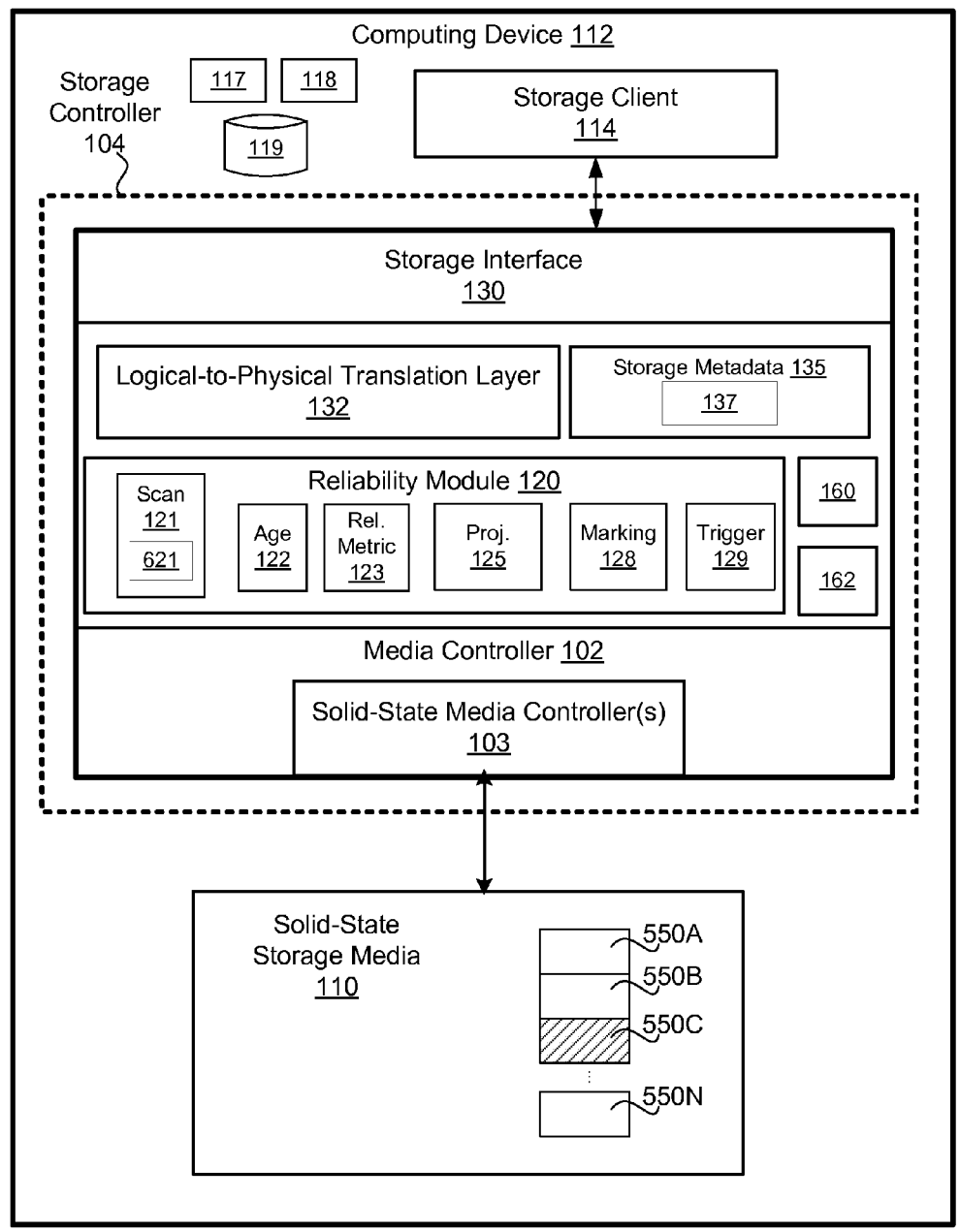
FIG. 6C is a block diagram of another embodiment of a storage controller comprising a reliability module.

FIG. 6C is a block diagram of another embodiment of a storage controller 104 configured to manage a solid-state storage media 110. The reliability module 120 of the FIG. 6C embodiment comprises a scan module 121, reliability metric module 123, and projection module 125, which may be configured to operate as described above.

The reliability module 120 may be configured to evaluate storage divisions 550A-N for retirement based on, inter alia, data age characteristics. As used herein, the storage divisions 550A-N may be individual erase blocks 530 and/or groups, collections, and/or sets of erase blocks 530A-N (e.g., logical erase blocks 540, portions of one or more logical erase blocks 540, or the like).

As described above, reliability metrics of storage divisions 550A-N comprising aged data may be inaccurate (e.g., aged data reliability metrics 781 derived from operations performed against data older than an age threshold $T_{AT}$ 794). Therefore, the reliability module 120 may be configured to evaluate storage divisions 550A-N for retirement based on data age characteristics of the storage divisions 550A-N. Non-aged storage divisions 550A-N (e.g., storage divisions 550A-N comprising data that is younger than the age threshold $T_{AT}$ 794) may be evaluated for retirement, as described herein. Aged storage divisions 550A-N that exhibit poor reliability characteristics may be scheduled for post-write reliability testing.

In some embodiments, the reliability module 120 comprises an age module 122 that is configured to determine the age of data stored on the storage divisions 550A-N (e.g., as part of one or more test read operation(s), as described above). Determining the age of the data may comprise determining a last program time of the storage division 550A-N (e.g., the last program time of the erase block(s) 530 comprising the storage divisions 550A-N), accessing metadata pertaining to the storage division 550A-N, which may include, but is not limited to, a reverse index, a validity bitmap, a sequence indicator of the storage division 550A-N, a timestamp, a sequence number or other sequence indicator, storage division metadata maintained by the storage controller 104, time indicator(s), system clock, or the like. For example, the storage controller 104 may be configured to store data in a sequential, log-based format, which may comprise marking sequence information on the solid-state storage media 110. The age of data on a storage division 550A-N may be derived from such sequence information. Alternatively, or in addition, the storage controller 104 may be configured to append data to the solid-state storage media 110 at an append point. The age of a storage division 550A-N may be determined based on the sequential order of the storage division 550A-N relative to a current append point.

A storage division 550A-N may be identified as an aged storage division in response to the age of data on the storage division 550A-N exceeding an age threshold $T_{AT}$ 794 (e.g., the differential $\Delta T_{D\_Age}$ 793 between the programming time $T_P$ 791 of the storage division 550A-N and the time that the reliability of the storage division 550A-N was determined $T_{RM\_2}$ 792 exceeds the age threshold $T_{AT}$ 794). As disclosed above, the age threshold $T_{AT}$ 794 may be based on the reliability model, configuration, user preferences, testing and experience, or the like. In some embodiments, the age threshold $T_{AT}$ 794 is 24 hours. When scanning a particular storage division 550C, the reliability module 120 may be configured to determine whether the storage division 550C is aged based, at least in part, on the age of the data stored thereon as indicated by the age module 122. If the storage division 550C satisfies the age threshold (data on the storage division 550C is younger than the age threshold $T_{AT}$ 794), the storage division 550C may be evaluated for retirement, as described herein (e.g., by determining the reliability metric 780 of the storage division 550C, projecting the reliability metric based on the data retention period Tpp 785, accumulating the reliability metric(s) of erase blocks 530A-N comprising the storage division 550C, and so on).

The reliability module 120 may be configured to defer retirement decisions pertaining to aged storage divisions 550A-N. In some embodiments, the reliability module 120 is configured to evaluate aged storage divisions 550A-N for post-write reliability testing. Post-write reliability testing may comprise determining a post-write reliability metric of the storage division 550A-N, which may include grooming the storage division 550A-N, programming data onto the storage division 550A-N, and evaluating the reliability of the storage division 550A-N within the age threshold $T_{AT}$ 794 (e.g., determining the reliability metric 780 of the storage division such that the differential $\Delta T_{D\_Age}$ between the programming time and the time the reliability metric is determined is less than the age threshold $T_{AT}$ 794). The reliability module 120 may determine whether to perform post-write reliability testing based on the aged data reliability metric 781 and/or aged data reliability projection 716D of the storage division 550A-N. For example, the reliability module 120 may mark a storage division 550C for post-write reliability testing in response to the time differential $\Delta T_{D\_Age}$ 793 of the storage division 550C exceeding the age threshold $T_{AT}$ 794 and the aged data reliability metric 781 of the storage division 550C failing to satisfy an aged data reliability threshold 796A and/or aged data reliability projection failing to satisfy an aged data reliability threshold 796B. The aged data reliability thresholds 796A and/or 796B may be different than the reliability threshold 782 used to determine whether to retire non-aged storage divisions 550A-N. For example, the aged data reliability threshold(s) 796A and/or 796B may be more stringent than the reliability threshold 782, since failure to satisfy these thresholds only results in further testing as opposed to retiring a storage resource.

In some embodiments, the post-write reliability test may comprise grooming the storage division 550C, reprogramming the storage division 550C (e.g., storing data on the storage division 550C subsequent to grooming as part of normal user and/or application workload storage operations and/or in one or more test operations), and determining a post-write reliability metric of the storage division 550C. Determining the post-write reliability metric may comprise performing one or more test read operations using the scan module 121, calculating a reliability metric using the reliability metric module 123, projecting the reliability metric using the projection module 125, and/or accumulating the projected reliability metric, as described herein.

The reliability module 120 may comprise a marking module 128 configured to mark storage divisions 550C for post-write reliability testing in response to, inter alia, the reliability module 120 determining that the storage division 550C comprises aged data, and determining that the reliability metric of the storage division 550C fails to satisfy one or more aged data reliability thresholds 796A and/or 796B. Marking the storage division 550C may comprise updating storage metadata 135, such as a forward index, reverse index, or the like (in the logical-to-physical translation layer 132) to indicate that the storage division 550C is marked for post-write reliability testing.

In some embodiments, the marking module 128 may be configured to store a persistent note on the solid-state storage media 110 pertaining to the post-write reliability test. As used herein, a persistent note refers to metadata (e.g., a metadata note) that is stored on a persistent storage medium, such as the solid-state storage media 110. The persistent note may identify the storage division 550C that is subject to the post-write reliability test. The note may further comprise a sequence indicator, or other timing metadata, associated with the post-write reliability test or the storage division 550C. The storage controller 104 may be configured to access the persistent note in response to grooming and/or storage operations, which may trigger a post-write reliability test on the storage division 550C, as described herein. Storing a persistent note may ensure that the post-write reliability test is crash safe, such that the post-write reliability test will be performed even if volatile metadata is lost due to an unclean shutdown or crash.

The groomer module 162 may be configured to prepare the storage division 550C for post-write reliability testing, by grooming the storage division 550C, which may comprise relocating valid data (if any) on the storage division 550C to other storage locations and erasing the storage division 550C, so that new data may be programmed thereon. The groomer module 162 may prioritize grooming the storage division 550C, which may reduce the chance that valid data stored on the storage division 550C will become unrecoverable due to, inter alia, further reliability degradation, excessively high error rate, and/or other failure conditions. The groomer module 162 may be configured to prioritize grooming the storage division 550C over other grooming operations (e.g., cause the storage division 550C to be groomed immediately, before grooming other storage divisions 550A-N), and/or over other storage requests (e.g., other foreground storage operations).

The storage division 550C may be reprogrammed after being groomed. The storage division 550C may be reprogrammed in response to storage requests from one or more storage clients 114. In some embodiments, the data may be mirrored on other storage location(s) on the solid-state storage media 110 (or other storage resources) to prevent data loss. Alternatively, or in addition, the reliability module 120 may be configured to program the storage division 550C with test data (as opposed to data of the storage clients 114). In some embodiments, only a portion of the storage capacity of the storage division 550C may be reprogrammed. Alternatively, the storage division 550C may be fully programmed before the post-write reliability metric is calculated.

A post-write reliability metric of the storage division 550C may be determined in response to reprogramming the storage division 550C. Accordingly, grooming the storage division 550C and/or programming the storage division 550C may be referred to as trigger events for post-write reliability testing. In some embodiments, the reliability module 120 comprises a trigger module 129 configured to identify storage divisions 550A-N that are ready for post-write reliability testing, which may comprise identifying storage divisions 550A-N that are marked for post-write reliability testing (e.g., in the storage metadata 135 and/or one or more persistent notes on the solid-state storage medium 110) and that have satisfied one or more trigger events for the post-write reliability test (e.g., have been groomed and/or have had a sufficient amount of data programmed thereon). The trigger module 129 may identify such storage divisions 550A-N by monitoring the operation of the storage controller 104, which may include monitoring changes to the storage metadata 135, monitoring the operation of the groomer module 162 (e.g., to detect grooming of the marked storage division 550C), monitoring the solid-state media controller(s) 103 (e.g., to detect storage of data on the marked storage division 550C subsequent to grooming), and so on. The trigger module 129 may be configured to invoke post-write reliability testing in response to identifying completion of the one or more trigger conditions on one or more marked storage divisions 550A-N.

Triggering post-write reliability testing may comprise configuring the reliability module 120 to evaluate the storage division 550C for retirement, which may comprise determining a post-write reliability metric of the storage division 550C (e.g., determining a reliability metric by use of the reliability metric module 123 based on test read operations performed by the scan module 121), calculating a projected reliability metric based on a reliability model, and/or determining to retire the storage division 550C (or portions thereof) based on the projected reliability metric, as described herein. The reliability module 120 may retire the storage division 550C in response to determining that storage division 550C fails to satisfy a post-write reliability threshold. In some embodiments, the post-write reliability threshold may be the same as the reliability threshold 782. Alternatively, the post-write reliability threshold may differ from the reliability threshold 782. For example, the post-write reliability metric may be more stringent to account for the relative recency at which the storage division 550C was programmed in the post-write reliability testing scenario. If the storage division 550C fails to satisfy the post-write reliability threshold, the storage division 550C (and/or portions thereof) may be retired, as described above. If the storage division 550C satisfies the post-write reliability threshold, the storage division 550C may remain in service (continue to be used to store data). The marking module 128 may be configured to remove the post-write reliability test marking(s) from the storage division 550C, which may comprise removing one or more entries in the storage metadata 135, invaliding one or more persistent notes on the non-volatile storage media 110 (and/or storage metadata 135), and so on. Alternatively, or in addition, the marking module 128 may be configured to update the marking(s) associated with the storage division 550C to indicate that the post-write reliability test is complete.

Figure 8A:
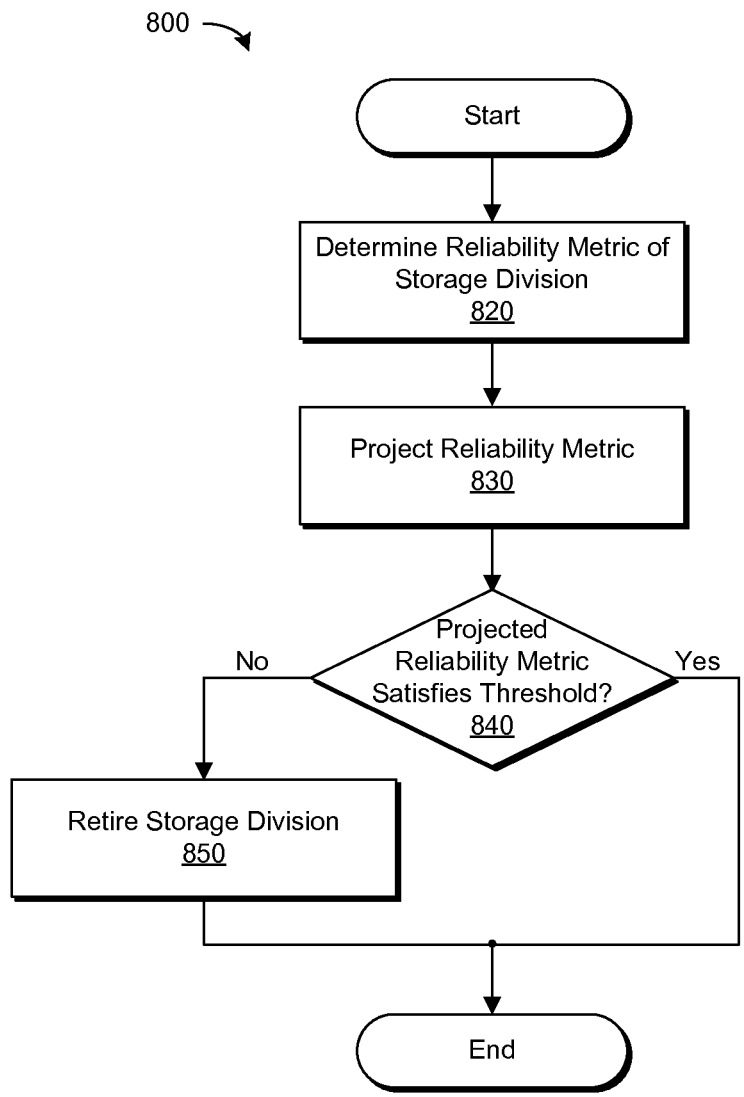
FIG. 8A is a flow diagram of one embodiment of a method for managing a solid-state storage medium.

FIG. 8A is a flow diagram of one embodiment of a method 800 for managing a solid-state storage medium. The method 800 may start and be initialized. As disclosed above, the method 800, and the other methods disclosed herein, may be embodied, at least in part, as instructions stored on a machine-readable storage medium. The instructions may be configured for execution by components of a computing device to thereby implement steps of the disclosed methods. Accordingly, starting and/or initializing the method 800 may comprise loading one or more instructions from a machine-readable storage medium and/or accessing computing device components and/or resources.

Step 820 may comprise determining a reliability metric of a storage division 550 (e.g., the RBER of the storage division 550). The reliability metric may be based on one or more storage operation(s) performed on the storage division 550 (e.g., one or more read operations). Accordingly, step 820 may comprise measuring storage division reliability by use of one or more test storage operations (e.g., performed by the scan module 121); the reliability of the storage division 550 may be based on an error rate of the one or more test storage operations. Step 820 may further comprise accessing and/or referencing error profiling data obtained by a media controller 102, or the like, as described above. The reliability metric may comprise an RBER of the storage division 550 (error rate of the one or more test storage operations). The reliability metric may comprise and/or incorporate any number of factors pertaining to storage division reliability including, but not limited to: RBER of the storage division 550, the wear level of the storage division 550 (e.g., program/erase cycle count), performance of the storage division 550 (e.g., time to program and/or erase), retry count (e.g., number program retries required), and so on. The reliability metric of step 820 may represent the current reliability metric of the storage division 550 (e.g., quantify the reliability of the storage division 550 at the time the test and/or other operation(s) upon which the reliability metric is based were performed).

Step 830 may comprise projecting, forecasting, and/or estimating a reliability metric of the storage division 550 at the end of a data retention period $T_{RP}$ 785. Step 830 may comprise using a reliability model to determine the projected reliability metric based on the reliability metric of step 820 and/or a reliability model, as described herein. The projection, forecast, and/or estimate may be based on, inter alia, the length of the data retention period $T_{RP}$ 785, temperature, erase cycle count, program cycle count, read count, manufacturer specifications, testing and experience, and so on. The projected reliability metric may comprise a projected RBER of the storage division at the end of a data retention period. Accordingly, step 830 may comprise forecasting and/or estimating the reliability metric in accordance with a data retention guarantee. Step 830 may comprise one or more of: scaling the reliability metric of step 820 by a time-based scaling factor, applying a reliability model of the storage division 550 and/or solid-state storage media 110. As described above, the reliability model may include, but is not limited to: a linear model (e.g., a time-based scaling function), an exponential model, a polynomial model, a spline model, a numerical model, an artificial neural network model, a radial basis function model, a combination of models, or the like, as described above. Applying the reliability model may comprise incorporating one or more operational factors, described above, such as temperature, storage division wear characteristics, and so on.

Step 840 may comprise determining whether the projected reliability metric of the storage division 550 satisfies a reliability threshold 782 and/or whether the storage division 550 is forecast or projected to satisfy the data retention guarantee (e.g., whether it can be reasonably guaranteed that data stored on the storage division 550 will be readable at the end of the data retention period). The reliability threshold 782 may be based on the number of errors that can be corrected in the data stored on the storage division 550 (e.g., the number of errors that can be corrected by the ECC read module 247 by use of an ECC coding of the data, or the like), data reconstruction data (e.g., parity data), data mirroring characteristics, user configuration, testing and experience, and/or the like. If the projected reliability metric fails to satisfy the reliability threshold 782, the flow may continue to step 850; otherwise, the flow may end.

Step 850 may comprise retiring the storage division 550, which may comprise removing the storage division 550 from service (e.g., taking the storage division 550 out of service). Step 850 may comprise configuring the storage controller 104 (and/or OOS management module 160) to avoid the storage division 550 and/or to stop using the storage division 550 to store data. Step 850 may comprise updating storage metadata 135, OOS metadata 137, configuring a media controller 102 to remap and/or replace the storage division 550, and so on. Step 850 may further comprise grooming the storage division 550 to relocate data stored thereon (if any) to other storage locations on the solid-state storage media 110 and/or other storage resource(s).

Figure 8B:
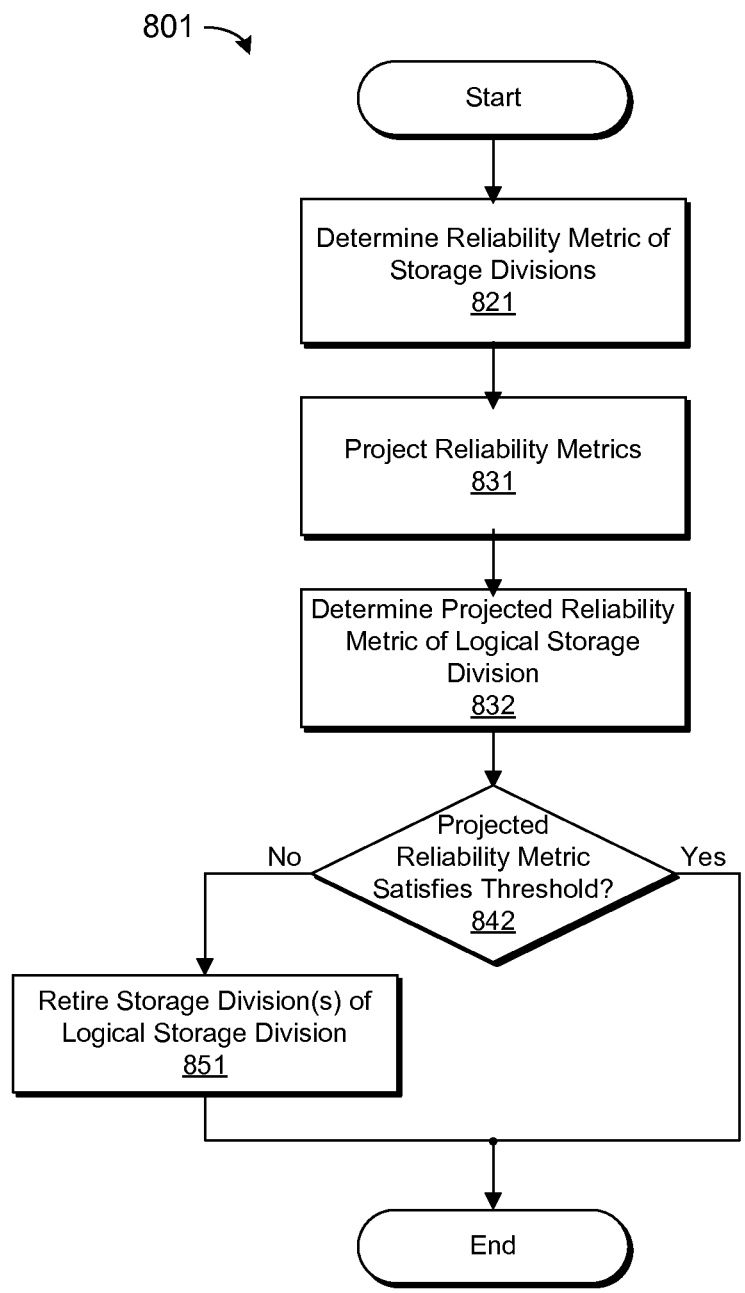
FIG. 8B is a flow diagram of another embodiment of a method for managing a solid-state storage medium.

FIG. 8B is a flow diagram of another embodiment of a method 801 for managing a solid-state storage medium. The method 801 may start and be initialized, as described above.

Step 821 may comprise determining a reliability metric of a storage division 550. In the FIG. 8B embodiment, the storage division 550 may comprise a plurality of erase blocks 530A-N; the storage division 550 may correspond to a logical erase block 540, a bank of solid-state storage elements 517A-N, or other group, collection, and/or set of erase blocks 530A-N. Step 821 may comprise determining the reliability metric of the two or more erase blocks 530A-N comprising the storage division 550. Step 821 may comprise accessing and/or referencing error profiling data, performing test operations on the storage division 550, and so on, as described herein. Step 821 may further comprise attributing errors (if any) detected in the test operations to particular erase blocks 530A-N. The reliability of the particular erase blocks 530A-N may be based on the errors attributed thereto.

Step 831 may comprise projecting, forecasting, and/or estimating the reliability of the two or more erase blocks 530A-N of the storage division 550 at the end of a data retention period $T_{RP}$ 785, as described herein. The projected reliability metrics may be based on a reliability model, which may incorporate various factors including, but not limited to: time (e.g., the data retention period $T_{RP}$ 785), operating conditions, wear levels, usage patterns, user configuration, feedback, testing and experience, and so on. Step 831 may, therefore, comprise applying a time-based reliability model to the current reliability metrics of the two or more erase blocks 530A-N to determine a projected, forecast, and/or estimated reliability of the respective erase blocks 530A-N in accordance with a data retention guarantee.

Step 832 may comprise projecting, forecasting, and/or estimating the reliability of the storage division 550 at the end of the data retention period $T_{RP}$ 785. Step 832 may comprise combining, aggregating, and/or averaging the individual erase block storage division reliability metrics of steps 821 and/or 831 (e.g., averaging the projected reliability metrics of the two or more erase blocks 530A-N).

Step 842 may comprise determining whether the projected reliability metric determined at step 832 satisfies a reliability threshold 782 and/or satisfies a data retention guarantee. As discussed above, the reliability threshold 782 may be based on various factors including, but not limited to: an error correction strength (ECC encoding), data reconstruction factors, data mirroring factors, user configuration, testing and experience, and so on. If the projected reliability metric of step 832 fails to satisfy the reliability threshold 782, the flow may continue to step 851; otherwise, the flow may end.

Step 851 may comprise retiring portions of the storage division 550, which may comprise retiring one or more of the erase blocks 530A-N comprising the storage division 550. Step 851 may comprise retiring erase blocks 530A-N with the poorest projected reliability metric (e.g., highest projected RBER). Retiring an erase block 530A-N may comprise remapping a replacement for the erase block 530A-N, masking the OOS erase block 530A-N, or the like, by use of the OOS management module 160 and/or OOS write module 266, as described herein. Step 851 may comprise retiring erase blocks 530A-N until the projected reliability metric of the storage division 550 satisfies the reliability threshold 782 (e.g., the average RBER of the remaining erase blocks 530A-N satisfies the reliability threshold 782). If more than a threshold number of erase blocks 530A-N must be retired to satisfy the reliability threshold 782 and/or the projected reliability metric of the storage division 550 cannot satisfy the reliability threshold 782 by removing/replacing erase blocks 530A-N, step 851 may comprise retiring the entire storage division 550 (e.g., all erase blocks 530A-N in the storage division 550 may be taken OOS).

Figure 9:
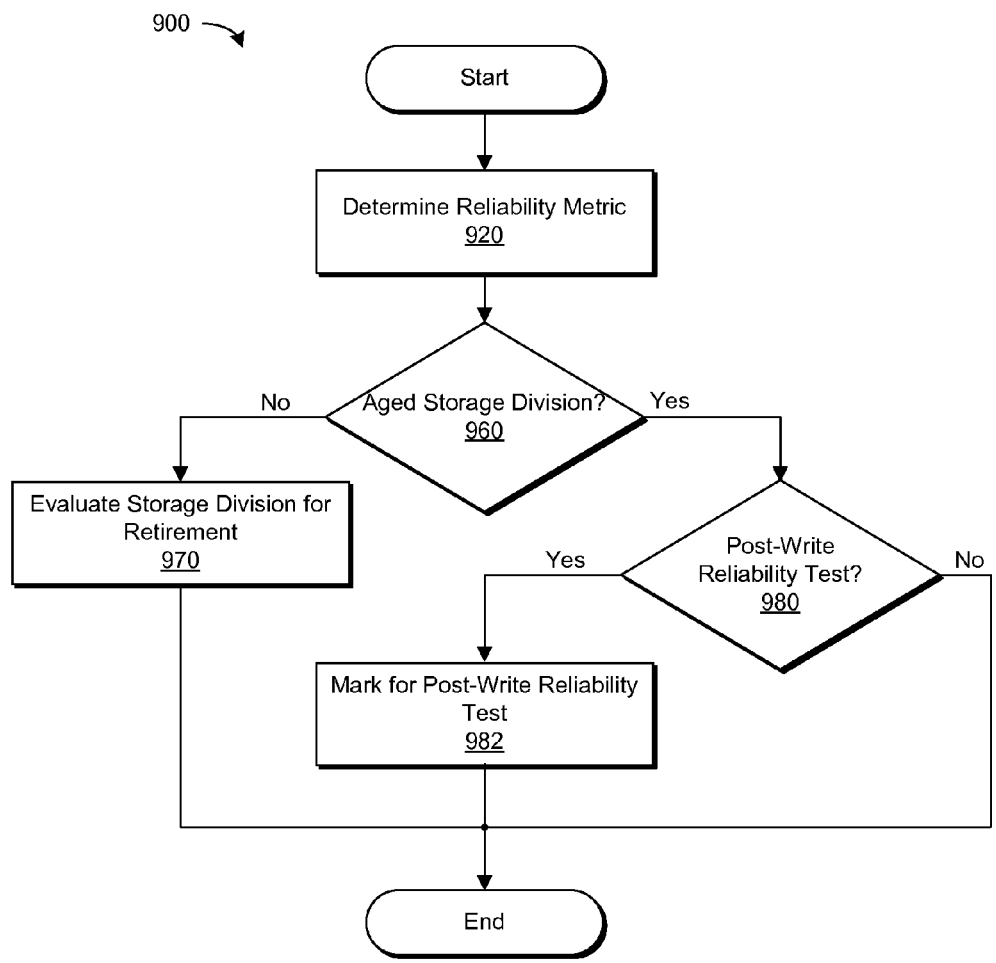
FIG. 9 is a flow diagram of another embodiment of a method for managing a solid-state storage medium.

FIG. 9 is a flow diagram of another embodiment of a method 900 for managing a solid-state storage medium. The method 900 may start and be initialized as described above.

Step 920 may comprise determining a reliability metric of a storage division 550, as described above. The storage division 550 of step 920 may comprise one or more erase blocks 530. Step 920 may comprise performing one or more test read operations on the storage division 550, determining a reliability metric of the storage division 550, and/or accumulating the reliability metrics of a plurality of erase blocks 530A-N, as described herein. Step 920 may further comprise projecting, forecasting, and/or estimating a projected reliability metric of the storage division 550 at the end of a data retention period $T_{RP}$ 785.

Step 960 may comprise determining whether the storage division 550 is aged (e.g., determining whether the storage division 550 comprises aged data). Step 960 may comprise determining the age of the data stored on the storage division 550 by use of the age module 122, as described above. Step 960 may further comprising comparing the age of the data to an age threshold (e.g., 24 hours), which may comprise determining the differential $\Delta T_{D\_Age}$ between the programming time $T_P$ of the storage division 550 and the time that the reliability of the storage division 550 was measured and comparing the time differential $\Delta T_{D\_Age}$ to an age threshold TAT. The storage division 550 may be considered to be aged if the time differential $\Delta T_{D\_Age}$ exceeds the age threshold TAT. If the storage division 550 was programmed within the age threshold $T_{AT}$ (e.g., within 24 hours of determining the reliability metric at step 920), the flow continues at step 970; otherwise, the flow continues at step 980.

Step 970 may comprise evaluating the storage division 550 for retirement as described above. Step 970 may comprise retiring the storage division 550 (and/or portions thereof) in response to determining that the storage division 550 fails to satisfy the reliability threshold 782. Step 970 may comprise determining a projected, forecast, and/or estimated reliability metric of the storage division 550 at the end of a data retention period $T_{RP}$ 785 by use of a reliability model. Step 970 may further comprise accumulating reliability metrics of each of a plurality of erase blocks 530A-N and retiring erase block(s) 530A-N until the accumulated projected reliability metric of the storage division 550 satisfies the reliability threshold 782 (or the entire storage division 550 is retired), as described herein.

Step 980 may comprise determining whether the storage division 550 should be marked for post-write reliability testing. Step 980 may comprise comparing the reliability metric (and/or projected reliability metric) determined at step 920 to an aged data reliability threshold 796A and/or 796B. The aged data reliability threshold(s) 796A and/or 796B may be the same or different than the reliability threshold 782 of step 970 (e.g., may be more or less stringent). The storage division 550 may be selected for post-write reliability testing in response to failing to satisfy the aged data reliability threshold(s) 796A and/or 796B, and the flow may continue to step 982.

Step 982 may comprise marking the storage division 550 for post-write reliability testing. Marking the storage division 550 may comprise updating storage metadata 135, storing a persistent note on the solid-state storage medium 110, or the like, as described herein. Step 982 may further comprise grooming the storage division 550. The grooming operation may be prioritized over other grooming operations and/or other storage operations and may comprise relocating valid data stored on the storage division 550 to other storage locations and/or erasing the storage division 550. Step 982 may further comprise storing data on the storage division 550 after the storage division 550 is groomed (e.g., reprogramming the storage division 550).

In some embodiments, step 982 comprises triggering a post-write reliability test in response to determining that the storage division 550 has been groomed and/or reprogrammed. Triggering may comprise monitoring one or more modules of the storage controller 104, such as the storage metadata 135, groomer 160, media controller 103, or the like. In response to triggering a post-write reliability test, the reliability module 120 may implement a post-write reliability test of the storage division 550.

Figure 10:
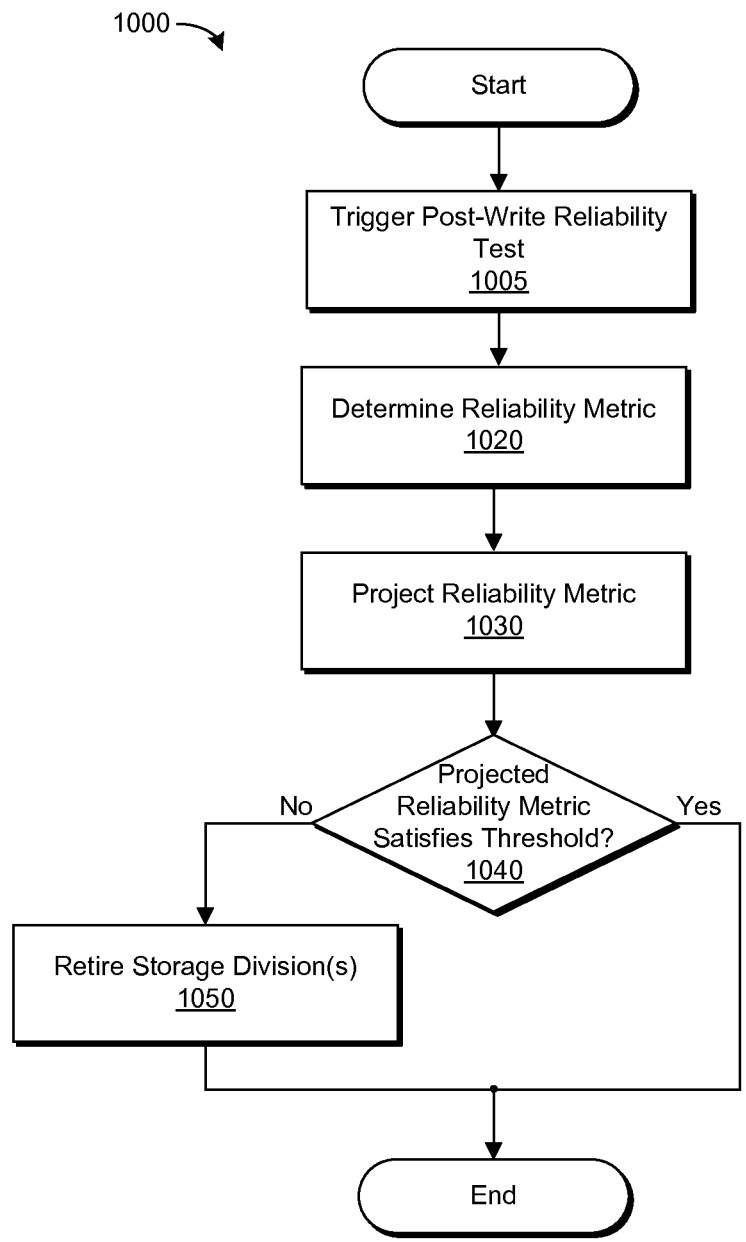
FIG. 10 is a flow diagram of another embodiment of a method for managing a solid-state storage medium.

FIG. 10 is a flow diagram of another embodiment of a method 1000 for managing a solid-state storage medium. The method 1000 may start and be initialized as described above.

Step 1005 may comprise triggering a post-write reliability test of a storage division 550. As described herein, the storage division 550 may comprise a single erase block 530 or a group, collection, and/or set of erase blocks 530A-N (e.g., a logical erase block 540 or portion thereof). Step 1005 may comprise determining that a marked storage division 550 is ready for post-write reliability testing (e.g., the storage division 550 has been groomed and/or reprogrammed). Step 1005 may be implemented by a trigger module 129 configured to monitor one or more modules of the storage controller 104, such as the storage metadata 135, groomer 160, media controller 103, or the like, to identify storage divisions 550 that are ready for post-write reliability testing.

As described above, data may be stored on a storage division 550 that has been marked for post-write reliability testing in response to storage requests from storage clients 114 and/or in response to test write operations of the reliability module 120. Accordingly, step 1005 may comprise monitoring and/or receiving an indication from the solid-state media controller 103 in response to storing data to the marked storage division 550 and/or reprogramming the marked storage division 550. Alternatively, or in addition, the trigger of step 1005 may comprise accessing a persistent note stored on the solid-state storage medium 110, which, as described above, may identify the storage division 550 as subject to post-write reliability testing.

Step 1020 may comprise determining a post-write reliability metric of the storage division 550. The post-write reliability metric may be based on one or more test read operations performed after the storage division 550 was groomed and/or reprogrammed. Step 1030 may comprise projecting the reliability metric to the end of a data retention period $T_{RP}$ 785 and/or accumulating the projected reliability metrics of one or more erase blocks 530A-N of the storage division 550.

Step 1040 may comprise determining whether the projected reliability metric of step 1030 satisfies a post-write reliability threshold. The post-write reliability threshold may be the same as the reliability threshold 782. Alternatively, the post-write reliability threshold 782 may differ from the reliability threshold 782; for example, the post-write reliability threshold of step 1040 may be more stringent to account for the recency at which the storage division 550 was programmed. If the projected reliability metric fails to satisfy the post-write reliability threshold, the flow continues to step 1050; otherwise, the flow ends.

Step 1050 may comprise retiring the storage division 550 and/or retiring portions of thereof (e.g., one or more erase blocks 530A-N), until the accumulated reliability metric of the storage division 550 satisfies the post-write reliability threshold of step 1040 (or the entire storage division 550 is retired), as described herein. Step 1050 may comprise updating OOS metadata 137 of the OOS management module 160 to ignore, avoid, and/or remap the retired storage division(s) 550. Step 1050 may further comprise grooming the storage division 550 to relocate valid data stored thereon (if any) to other storage locations.

This disclosure has been made with reference to various exemplary embodiments. However, those skilled in the art will recognize that changes and modifications may be made to the exemplary embodiments without departing from the scope of the present disclosure. For example, various operational steps, as well as components for carrying out operational steps, may be implemented in alternate ways depending upon the particular application or in consideration of any number of cost functions associated with the operation of the system (e.g., one or more of the steps may be deleted, modified, or combined with other steps). Therefore, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. As used herein, the terms "comprises," "comprising," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Additionally, principles of the present disclosure may be reflected in a computer program product on a machine-readable storage medium having machine-readable program code means embodied in the storage medium. Any tangible, machine-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, programmable computer (e.g., FPGA), or other processing device to produce a machine, such that the instructions that execute on the computer or other programmable data processing apparatus create means for implementing the functions specified. These computer program instructions may also be stored in a machine-readable memory that can direct a computer or other programmable data processing apparatus to function in a particular manner, such that the instructions stored in the machine-readable memory produce an article of manufacture, including implementing means that implement the function specified. The computer program instructions may also be loaded onto a computer or other programmable data processing apparatus to cause a series of operational steps to be performed on the computer or other programmable apparatus to produce a computer-implemented process, such that the instructions that execute on the computer or other programmable apparatus provide steps for implementing the functions specified.

While the principles of this disclosure have been shown in various embodiments, many modifications of structure, arrangements, proportions, elements, materials, and components that are particularly adapted for a specific environment and operating requirements may be used without departing from the principles and scope of this disclosure. These and other changes or modifications are intended to be included within the scope of the present disclosure.

We claim:

1. An apparatus, comprising:
a reliability metric module configured to determine a reliability metric of a section of the solid-state storage medium based on a storage operation performed on the section;
a projection module configured to determine a projected reliability metric for the section that estimates reliability of the section after data has been stored on the section for a retention time period; and
a reliability module configured to retire the section in response to the projected reliability metric failing to satisfy a reliability threshold,
wherein the reliability metric module, the projection module, and the reliability module comprise one or more of logic hardware and a non-transitory, computer-readable storage medium comprising executable code configured for execution by a processor.

2. The apparatus of claim 1, further comprising a groomer module configured to relocate data stored on the section.

3. The apparatus of claim 1, wherein the reliability threshold is based on a number of errors that can be corrected by an error-correcting encoding of data stored on the solid-state storage medium.

4. The apparatus of claim 1, wherein the reliability metric module is configured to determine an error rate of storage units in the section based on an error rate of the storage operation.

5. The apparatus of claim 1, wherein the projection module is configured to project the reliability metric by use of one or more of a reliability scaling factor and a reliability model, and wherein the reliability model comprises one or more of a linear model, an exponential model, a polynomial model, a spline model, an artificial neural network model, a radial basis function model, and a numerical model.

6. The apparatus of claim 1, wherein the section comprises a plurality of erase blocks, and wherein the projected reliability metric of the section is based on projected reliability metrics of the plurality of erase blocks.

7. The apparatus of claim 6, wherein the reliability metric module is configured to determine a reliability metric of an erase block based on storage operation errors attributed to the erase block.

8. The apparatus of claim 7, further comprising an accumulation module configured to determine the projected reliability metric of the section based on projected reliability metrics of the plurality of erase blocks.

9. The apparatus of claim 8, wherein the projected reliability metric of the section comprises an average of the projected reliability metrics of the plurality of erase blocks.

10. The apparatus of claim 6, wherein the reliability module is configured to retire one or more of the plurality of erase blocks in response the projected reliability metric of the section failing to satisfy the reliability threshold.

11. The apparatus of claim 10, wherein the reliability module is configured to replace a retired erase block with a replacement erase block and to determine an updated projected reliability metric of the section based on a projected reliability metric of the replacement erase block.

12. The apparatus of claim 1, further comprising a scan module configured to perform one or more test storage operations on the section, wherein the scan module is configured to perform test operations on storage units within the section according to a scanning pattern, and wherein the reliability metric module is configured to determine the reliability metric of the section based on errors in one or more of the test storage operations.

13. The apparatus of claim 1, wherein the section is configured according to a granularity of storage operations performed on the solid-state storage medium.

14. A machine-readable storage medium comprising instructions configured to cause a computing device to perform a method, comprising:
   forecasting reliability of a portion of a solid-state storage medium, wherein the reliability forecast is based on a current reliability metric of the portion and corresponds to reliability of the portion of the solid-state storage medium after data has been retained on the portion of the solid-state storage medium for a pre-determined time period; and
   removing the portion of the solid-state storage medium from service in response to the reliability forecast failing to satisfy a data retention guarantee.

15. The machine-readable storage medium of claim 14, wherein removing the portion from service comprises relocating data stored on the portion of the solid-state storage medium.

16. The machine-readable storage medium of claim 14, wherein the data retention guarantee is based on one or more of an error-correcting code strength and a data reconstruction capability for data stored on the portion of the solid-state storage medium.

17. The machine-readable storage medium of claim 14, wherein the current reliability metric is based on an error rate of one or more test read operations performed on storage units of the portion of the solid-state storage medium.

18. The machine-readable storage medium of claim 14, wherein the portion comprises a plurality of erase blocks, and wherein forecasting the reliability of the portion comprises combining reliability forecasts of the plurality of erase blocks, the method further comprising:
   removing one or more erase blocks of the portion from service in response to the combined reliability forecast failing to satisfy the data retention guarantee.

19. The machine-readable storage medium of claim 18, the method further comprising attributing errors of one or more test read operations performed on storage units of the portion of the solid-state storage medium to respective erase blocks, wherein the reliability forecasts of the respective erase blocks are derived from errors attributed to the respective erase blocks.

20. A system, comprising:
   means for measuring storage division reliability by use of one or more test read operations performed on storage units of the storage division;
   means for determining a reliability estimate for a storage division, wherein the reliability estimate is based on the measured storage division reliability and a reliability model, such that the reliability estimate forecasts reliability of the storage division after data is retained on the storage division for a data retention period; and
   means for retiring the storage division in response to the estimated reliability estimate of the storage division failing to satisfy a reliability threshold.

21. The system of claim 20, wherein the storage division comprises a plurality of erase blocks,
   wherein the means for measuring storage division reliability comprises means for attributing errors in the one or more test read operations to respective erase blocks of the storage division and means for determining a respective reliability metric for each erase block based on the errors attributed to the respective erase blocks, and
   wherein the means for determining the reliability estimate of the storage division comprises means for determining reliability estimates of the respective erase blocks, and
   wherein the means for retiring the storage division comprises means for retiring one or more of the erase blocks of the storage division in response to the reliability estimate failing to satisfy the reliability threshold.

* * * * *